United States Patent
Yoon et al.

(10) Patent No.: US 12,057,156 B2
(45) Date of Patent: *Aug. 6, 2024

(54) QUADRATURE ERROR CORRECTION CIRCUIT AND SEMICONDUCTOR MEMORY DEVICE INCLUDING THE SAME

(71) Applicant: Samsung Electronics Co., Ltd., Suwon-si (KR)

(72) Inventors: Hojun Yoon, Hwaseong-si (KR); Wonjoo Jung, Bucheon-si (KR); Jaewoo Park, Yongin-si (KR); Youngchul Cho, Seongnam-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/218,243

(22) Filed: Jul. 5, 2023

(65) Prior Publication Data
US 2023/0343383 A1 Oct. 26, 2023

Related U.S. Application Data

(63) Continuation of application No. 17/508,598, filed on Oct. 22, 2021, now Pat. No. 11,742,016.

(30) Foreign Application Priority Data

Apr. 20, 2021 (KR) ........................ 10-2021-0050830

(51) Int. Cl.
*G11C 7/22* (2006.01)
*G11C 11/4076* (2006.01)
(Continued)

(52) U.S. Cl.
CPC .......... *G11C 11/4076* (2013.01); *G11C 7/222* (2013.01); *G11C 29/023* (2013.01);
(Continued)

(58) Field of Classification Search
CPC ... G11C 11/4076; G11C 7/222; G11C 29/023; G11C 29/028; H03K 5/1565; H03K 5/12; H03B 27/00
See application file for complete search history.

(56) References Cited

U.S. PATENT DOCUMENTS 5,945,862 A * 8/1999 Donnelly ............. H03K 5/1565
327/279
6,310,513 B1 10/2001 Iemura
(Continued)

FOREIGN PATENT DOCUMENTS

KR 10-2018-0070835 A 6/2018

*Primary Examiner* — Mushfique Siddique
(74) *Attorney, Agent, or Firm* — Muir Patent Law, PLLC

(57) ABSTRACT

A quadrature error correction circuit includes a duty cycle adjusting circuit, a phase interpolator, a phase detector, and a delay control circuit. The duty cycle adjusting circuit generates a first corrected clock signal and a second corrected clock signal whose skew and duty cycle error are concurrently adjusted by adjusting a delay of edges of a second clock signal and adjusting a delay of a falling edge of a first clock signal based on first through fourth control code sets. The phase interpolator generates a second delayed and selected clock signal by delaying a second selected clock signal selected from first through fourth adjusted clock signals. A phase detector detects a phase difference between a first selected clock signal and the second delayed and selected clock signal to generate an up/down signal. The delay control circuit generates the first through fourth control code sets based on the up/down signal.

20 Claims, 29 Drawing Sheets

(51) Int. Cl.
  *G11C 29/02*  (2006.01)
  *H03K 5/156*  (2006.01)
  *H03K 5/12*  (2006.01)

(52) U.S. Cl.
  CPC ......... *H03K 5/1565* (2013.01); *G11C 29/028* (2013.01); *H03K 5/12* (2013.01)

(56) References Cited

U.S. PATENT DOCUMENTS

| | | |
|---|---|---|
| 7,184,509 B2 | 2/2007 | Cho et al. |
| 8,072,253 B2 | 12/2011 | Kaeriyama et al. |
| 8,624,647 B2 | 1/2014 | Chong et al. |
| 8,797,076 B2 | 8/2014 | Kibune |
| 10,038,432 B2 | 7/2018 | Jung |
| 10,250,243 B2 | 4/2019 | Lee et al. |
| 10,566,961 B2 | 2/2020 | Lee et al. |
| 10,630,272 B1 | 4/2020 | Ashtiani et al. |
| 2008/0036509 A1 | 2/2008 | Jang |
| 2009/0256610 A1 | 10/2009 | Yoon et al. |
| 2010/0124137 A1* | 5/2010 | Kim .................... G11C 7/1057 365/219 |
| 2011/0028513 A1 | 12/2011 | Na et al. |
| 2017/0040986 A1 | 2/2017 | Ma |
| 2020/0059226 A1 | 2/2020 | Choi et al. |
| 2022/0343957 A1 | 10/2022 | Yoon et al. |

\* cited by examiner

QUADRATURE ERROR CORRECTION CIRCUIT AND SEMICONDUCTOR MEMORY DEVICE INCLUDING THE SAME

CROSS-REFERENCE TO RELATED APPLICATIONS

This application is a continuation application of U.S. patent application Ser. No. 17/508,598, filed Oct. 22, 2021, which claims the benefit of priority under 35 USC § 119 to Korean Patent Application No. 10-2021-0050830, filed on Apr. 20, 2021, in the Korean Intellectual Property Office, the disclosures of each of which are incorporated by reference in its entirety herein.

BACKGROUND

The present disclosure relates to memories, and more particularly to quadrature error correction circuits in semiconductor memory devices and semiconductor memory devices.

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

A semiconductor memory device may operate in synchronization with a clock applied from an outside. When the externally applied clock is used in the semiconductor memory device, a time delay (or a clock skew) may occur due to an internal circuit of the semiconductor memory device. A circuit may be used to compensate for the time delay and correcting duty cycle error.

SUMMARY

Example embodiments may provide a quadrature error correction circuit capable of concurrently correcting a skew and a duty cycle of clock signals.

Example embodiments may provide a semiconductor memory device including a quadrature error correction circuit capable of concurrently correcting a skew and a duty cycle of clock signals.

According to example embodiments, a quadrature error correction circuit in a semiconductor memory device includes a duty cycle adjusting circuit, a first phase splitter, a second phase splitter, a phase interpolator, a phase detector, and a delay control circuit. The duty cycle adjusting circuit receives a first clock signal and a second clock signal which are generated based on a data clock signal, and generates a first corrected clock signal and a second corrected clock signal which have a phase difference of 90 degrees with respect to each other and whose skew and duty cycle error are concurrently adjusted by adjusting a delay of a rising edge of the second clock signal with respect to a rising edge of the first clock signal, adjusting a delay of a falling edge of the first clock signal with respect to the adjusted rising edge of the second clock signal and adjusting a delay of a falling edge of the second clock signal with respect to the adjusted falling edge of the first clock signal, based on a first control code set, a second control code set, a third control code set, and a fixed control code set. The first clock signal and the second clock signal have a phase difference of 90 degrees with respect to each other. The first phase splitter splits a phase of the first corrected clock signal to output a first adjusted clock signal and a third adjusted clock signal having a phase difference of 180 degrees with respect to each other. The second phase splitter splits a phase of the second corrected clock signal to output a second adjusted clock signal and a fourth adjusted clock signal having a phase difference of 180 degrees with respect to each other. The phase interpolator generates a second delayed and selected clock signal by delaying a second selected clock signal having a phase difference of 90 degrees with respect to a first selected clock signal, based on a fourth control code set, and the first selected clock signal and the second selected clock signal are selected from among the first through fourth adjusted clock signals. The phase detector detects a phase difference between the first selected clock signal and the second delayed and selected clock signal to generate an up/down signal. The delay control circuit generates the first through fourth control code sets based on the up/down signal.

According to example embodiments, a semiconductor memory device includes a data clock buffer, a quadrature error correction circuit, a clock generation circuit, and a data input/output (I/O) buffer. The data clock buffer generates a first clock signal and a second clock signal which have a phase difference of 90 degrees with respect to each other, based on a data clock signal received from a memory controller. The quadrature error correction circuit generates a first corrected clock signal and a second corrected clock signal which have a phase difference of 90 degrees with respect to each other by concurrently adjusting a skew and a duty cycle error of the first clock signal and the second clock signal. The clock generation circuit generates an output clock signal and a strobe signal based on the first corrected clock signal and the second corrected clock signal. The data input/output (I/O) buffer generates a data signal by sampling data from a memory cell array based on the output clock signal and transmits the data signal and the strobe signal to the memory controller.

According to example embodiments, a quadrature error correction circuit in a semiconductor memory device includes a duty cycle adjusting circuit, a first phase shifter, a second phase splitter, a first multiplexer, a second multiplexer, a phase interpolator, a phase detector, and a delay control circuit. The duty cycle adjusting circuit receives a first clock signal and a second clock signal which are generated based on a data clock signal, and generates a first corrected clock signal and a second corrected clock signal which have a phase difference of 90 degrees with respect to each other and whose skew and duty cycle error are concurrently adjusted by adjusting a delay of a rising edge of the second clock signal with respect to a rising edge of the first clock signal, adjusting a delay of a falling edge of the first clock signal with respect to the adjusted rising edge of the second clock signal and adjusting a delay of a falling edge of the second clock signal with respect to the adjusted falling edge of the first clock signal, based on a first control code set, a second control code set, a third control code set, and a fixed control code set. The first clock signal and the second clock signal have a phase difference of 90 degrees with respect to each other. The first phase splitter splits a phase of the first corrected clock signal to output a first adjusted clock signal and a third adjusted clock signal having a phase difference of 180 degrees with respect to each other. The second phase splitter splits a phase of the second corrected clock signal to output a second adjusted clock signal and a fourth adjusted clock signal having a phase difference of 180 degrees with respect to each other. The first multiplexer selects a first one of the first through fourth adjusted clock signal as a first selected clock signal based on a first selection signal. The second multiplexer selects a second of the first through fourth adjusted clock signal as a second selected clock signal based on a second selection signal and the second one has a phase difference of 90 degrees with respect to the first selected clock signal. The phase interpolator generates a second delayed and selected clock signal by delaying the second selected clock signal based on a fourth control code set. The phase detector detects a phase difference between the first selected clock signal and the second delayed and selected clock signal to generate an up/down signal. The delay control circuit generates the first through fourth control code sets based on the up/down signal.

Accordingly, the quadrature error correction circuit generates the first corrected clock signal and the second corrected clock signal by concurrently adjusting a skew and a duty cycle error of the first clock signal and the second clock signal which are generated based on the data clock signal, the clock generation circuit generates the output clock signal with multi-phase based on the first corrected clock signal and the second corrected clock signal, and the data input/output (I/O) buffer outputs the data signal by sampling the data from the memory cell array based on the output clock signal. Therefore, the semiconductor memory device may enhance performance.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
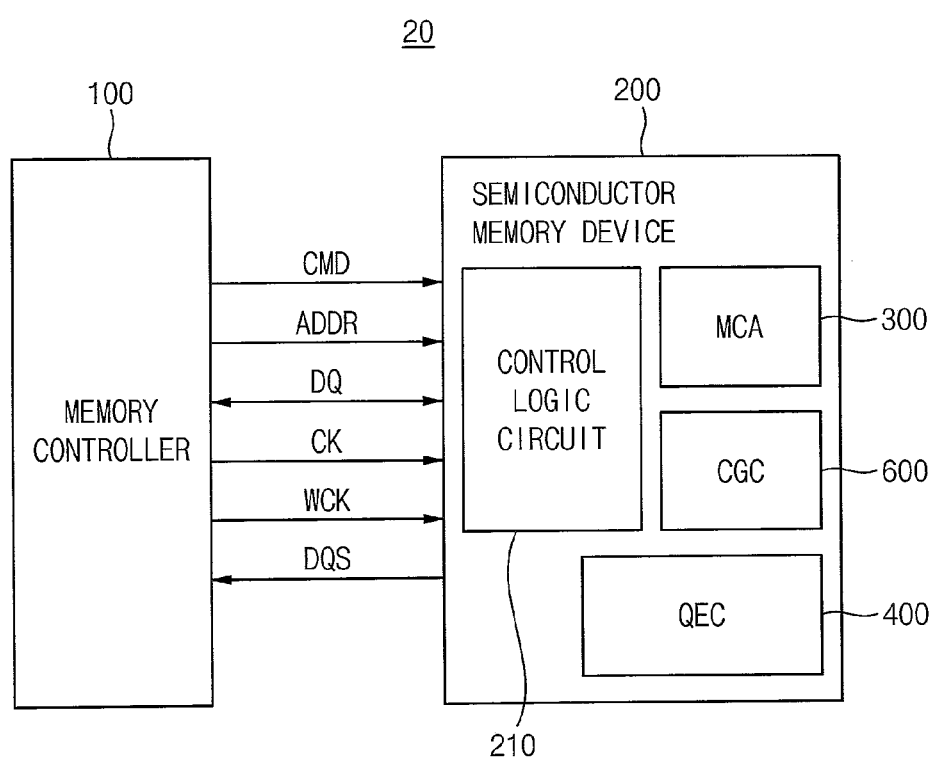
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to a request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CK (the clock signal CK may be referred to as a command clock signal), a command CMD, and an address (signal) ADDR to the semiconductor memory device 200. The memory controller 100 may transmit a data clock signal WCK to the semiconductor memory device 200 when the memory controller 100 writes data signal DQ in the semiconductor memory device 200 or reads data signal DQ from the semiconductor memory device 200. The semiconductor memory device 200 may transmit a strobe signal DQS along with the data signal DQ to the memory controller 100 when the semiconductor memory device 200 transmits the data signal DQ to the memory controller 100.

The semiconductor memory device 200 includes a memory cell array 300 that stores the data signal DQ, a control logic circuit 210, a quadrature error correction circuit (QEC) 400 and a clock generation circuit (CGC) 600. The semiconductor memory device 200 may be in the form of a semiconductor chip formed on a die, a stack of such semiconductor chips, a semiconductor package including one or more semiconductor chips formed on a package substrate and encapsulated with a mold layer, or a package-on-package device.

The control logic circuit 210 may control operations of the semiconductor memory device 200. The quadrature error correction circuit 400 may generate a first corrected clock signal and a second corrected clock signal which have a phase difference of 90 degrees with respect to each other by concurrently adjusting a skew and a duty cycle error of a first clock signal and a second clock signal which have a phase difference of 90 degrees with respect to each other based on the data clock signal WCK. The duty cycle error described herein refers to a difference in duty cycle between the first clock signal and the second clock signal. Adjusting the duty cycle error refers to adjusting the signal to reduce and/or remove a difference in duty cycle between the first clock signal and the second clock signal. Adjusting the skew refers to adjusting the signal to reduce and/or remove a timing delay between rising edges and/or falling edges of the first clock signal and the second clock signal. The clock generation circuit 600 generate an output clock signal and the strobe signal DQS based on the first corrected clock signal and the second corrected clock signal.

Figure 2:
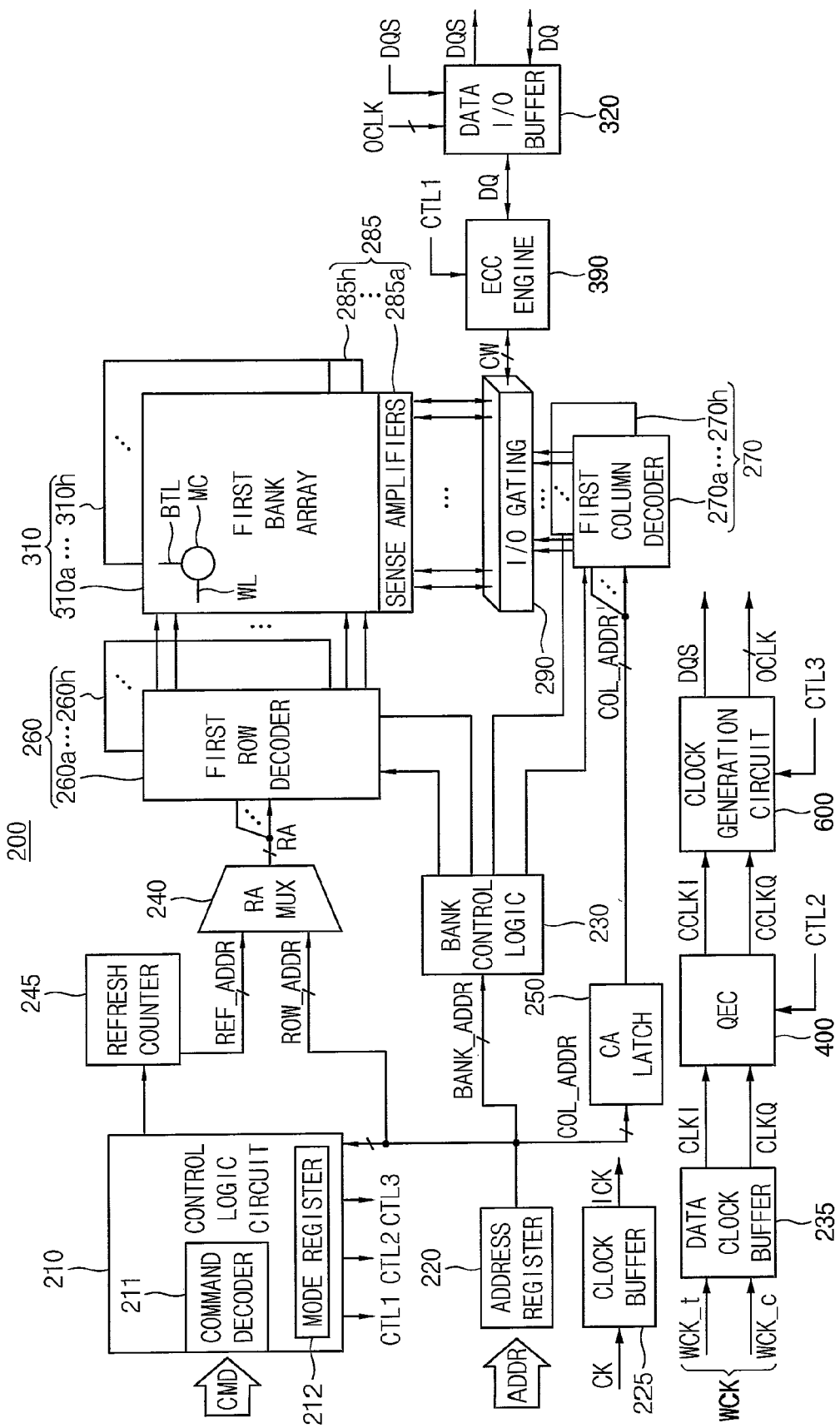
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200a may include the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, an error correction code (ECC) engine 390, a clock buffer 225, a data clock buffer 235, the quadrature error correction circuit 400, a clock generation circuit 600 and a data I/O buffer 320.

The memory cell array 300 includes first through eighth bank arrays 310a-310h. The row decoder 260 includes first through eighth row decoders 260a-260h respectively coupled to the first through eighth bank arrays 310a-310h, the column decoder 270 includes first through eighth column decoders 270a-270h respectively coupled to the first through eighth bank arrays 310a-310h, and the sense amplifier unit 285 includes first through eighth sense amplifiers 285a-285h respectively coupled to the first through eighth bank arrays 310a-310h.

The first through eighth bank arrays 310a-310h, the first through eighth row decoders 260a-260h, the first through eighth column decoders 270a-270h and first through eighth sense amplifiers 285a-285h may form first through eighth banks. Each of the first through eighth bank arrays 310a-310h includes a plurality of memory cells MC formed at intersections of a plurality of word-lines WL and a plurality of bit-lines BTL.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth row decoders 260a-260h corresponding to the bank address BANK_ADDR is activated in response to the bank control signals, and one of the first through eighth column decoders 270a-270h corresponding to the bank address BANK_ADDR is activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 is applied to the first through eighth row decoders 260a-260h.

The refresh counter 245 may sequentially increase or decrease the refresh row address REF_ADDR under control of the control logic circuit 210.

The activated one of the first through eighth row decoders 260a-260h, by the bank control logic 230, may decode the row address RA that is output from the row address multiplexer 240, and may activate a word-line corresponding to the row address RA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column addresses COL_ADDR' to the first through eighth column decoders 270a-270h.

The activated one of the first through eighth column decoders 270a-270h activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through eighth bank arrays 310a-310h, and write drivers for writing data to the first through eighth bank arrays 310a-310h.

Codeword CW read from one bank array of the first through eighth bank arrays 310a-310h is sensed by a sense amplifier coupled to the one bank array from which the data is to be read, and is stored in the read data latches. The codeword CW stored in the read data latches may be provided to the data I/O buffer 320 as data DTA after ECC decoding is performed on the codeword CW by the ECC engine 390. The data I/O buffer 320 may convert the data DTA into the data signal DQ based on output clock signals OCLK and may transmit the data signal DQ along with the strobe signal DQS to the memory controller 100.

The data signal DQ to be written in one bank array of the first through eighth bank arrays 310a-310h may be provided to the data I/O buffer 320 from the memory controller 100. The data I/O buffer 320 may convert the data signal DQ to the data DTA and may provide the data DTA to the ECC engine 390. The ECC engine 390 may perform an ECC encoding on the data DTA to generate parity bits, and the ECC engine 390 may provide the codeword CW including data DTA and the parity bits to the I/O gating circuit 290. The I/O gating circuit 290 may write the codeword CW in a sub-page in one bank array through the write drivers.

The data I/O buffer 320 may provide the data signal DQ from the memory controller 100 to the ECC engine 400 by converting the data signal DQ to the data DTA in a write operation of the semiconductor memory device 200 and may convert the data DTA to the data signal DQ from the ECC engine 390 based on the output clock signals OCLK from the clock generation circuit 600, and may transmit the data signal DQ and the strobe signal DQS to the memory controller 100 in a read operation of the semiconductor memory device 200. The data I/O buffer 320 may output the data signal DQ to the outside (e.g., outside of the semiconductor memory device) based on the output clock signals OCLK in the read operation.

The ECC engine 390 may perform an ECC encoding and an ECC decoding on the data DTA based on a first control signal CTL1 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The data clock buffer 235 may receive the data clock signal WCK including differential clock signal pair WCK_t and WCK_c, may generate a first clock signal CLKI and a second clock signal CLKQ which have a phase difference of 90 degrees with respect to each other, based on the data clock signal WCK and may provide the first clock signal CLKI and the second clock signal CLKQ to the quadrature error correction circuit 400. The first clock signal CLKI may be referred to an in-phase clock signal and the second clock signal CLKQ may be referred to a quadrature-phase clock signal.

The quadrature error correction circuit 400 may generate a first corrected clock signal CCLKI and a second corrected clock signal CCLKQ which have a phase difference of 90 degrees with respect to each other by concurrently adjusting a skew and a duty error of the first clock signal CLKI and the second clock signal CLKQ and may provide the first corrected clock signal CCLKI and the second corrected clock signal CCLKQ to the clock generation circuit 600.

The clock generation circuit 600 may generate the output clock signal OCLK and the strobe signal DQS based on the first corrected clock signal CCLKI and the second corrected clock signal CCLKQ and may provide the output clock signal OCLK and the strobe signal DQS to the data I/O buffer 320.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate the first control signal CTL1 to control the ECC engine 390, a second control signal CTL2 to control the quadrature error correction circuit 400 and a third control signal CTL3 to control the clock generation circuit 600.

Figure 3:
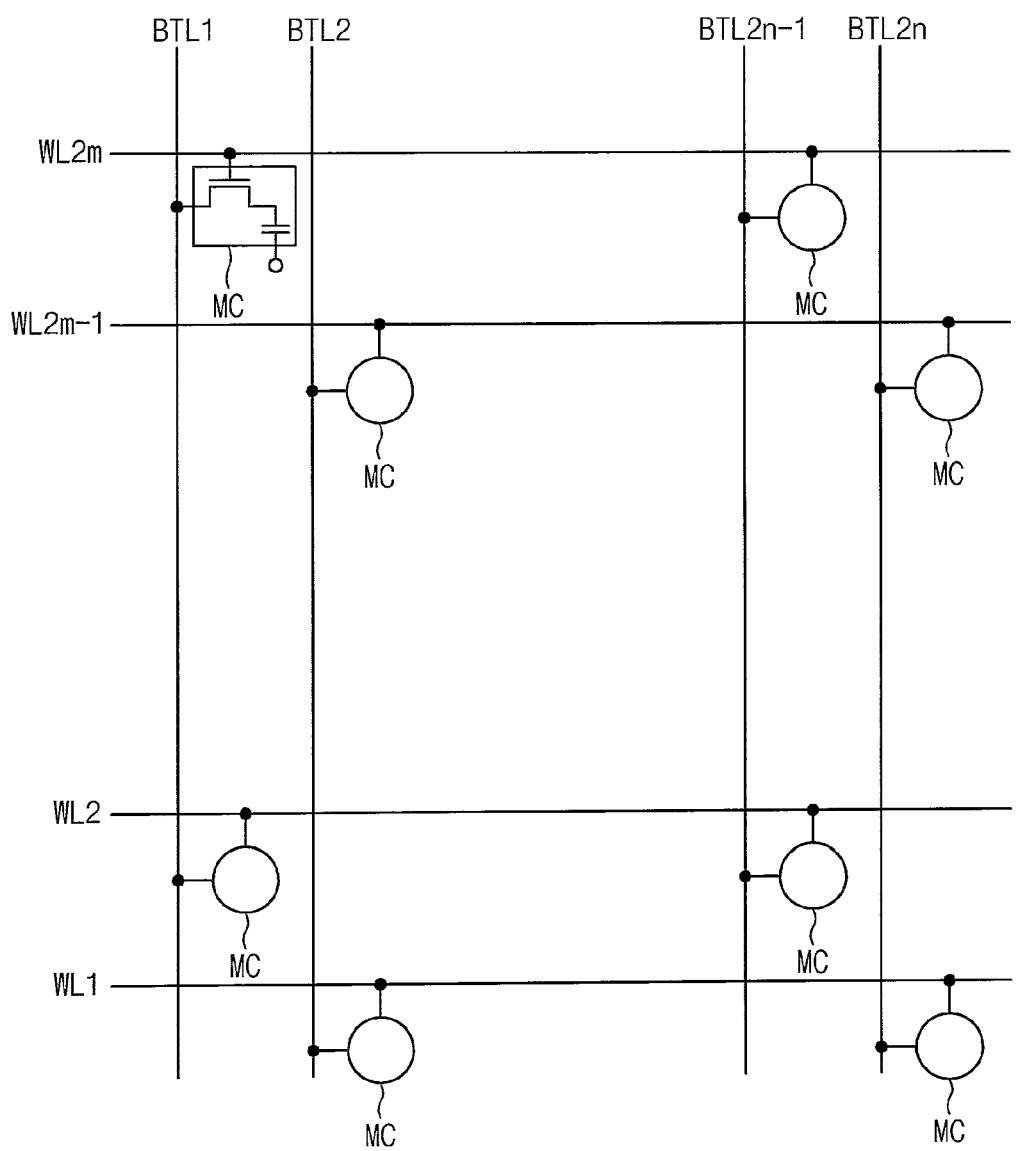
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 includes a plurality of word-lines WL1~WL2m (m is a natural number greater than two), a plurality of bit-lines BTL1~BTL2n (n is a natural number greater than two), and a plurality of memory cells MCs disposed at intersections between the word-lines WL1~WL2m and the bit-lines BTL1~BTL2n. Each of the memory cells MCs includes a cell transistor coupled to each of the word-lines WL1~WL2m and each of the bit-lines BTL1~BTL2n and a cell capacitor coupled to the cell transistor.

The word-lines WL1~WL2m coupled to the a plurality of memory cells MCs may be referred to as rows of the first bank array 310 and the bit-lines BTL1~BT2Ln coupled to the a plurality of memory cells MCs may be referred to as columns of the first bank array 310.

Figure 4:
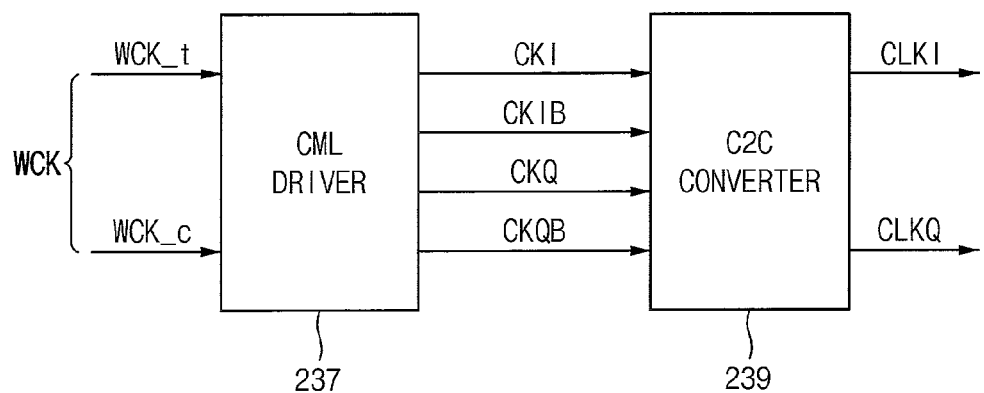
FIG. 4 is a block diagram illustrating an example of the data clock buffer in the semiconductor memory device of FIG. 2 according to example embodiments.

FIG. 4 is a block diagram illustrating an example of the data clock buffer in the semiconductor memory device of FIG. 2 according to example embodiments.

Referring to FIG. 4, the data clock buffer 235 may include a current mode logic (CML) driver 237 and a CML to complementary metal-oxide semiconductor (CMOS) level (C2C) converter 239.

The CML driver 237 may drive the data clock signal WCK including differential clock signal pair WCK_t and WCK_c and have a CML level to generate internal clock signals CKI, CKQ, CKIB and CKQB which have a phase difference of 90 degrees with respect to one another and the C2C converter 239 may generate the first clock signal CLKI and the second clock signal CLKQ which have a phase difference of 90 degrees with respect to each other, based on the data clock signal WCK and have a CMOS level. The C2C converter 239 may provide the first clock signal CLKI and the second clock signal CLKQ to the quadrature error correction circuit 400 in FIG. 2.

Figure 5:
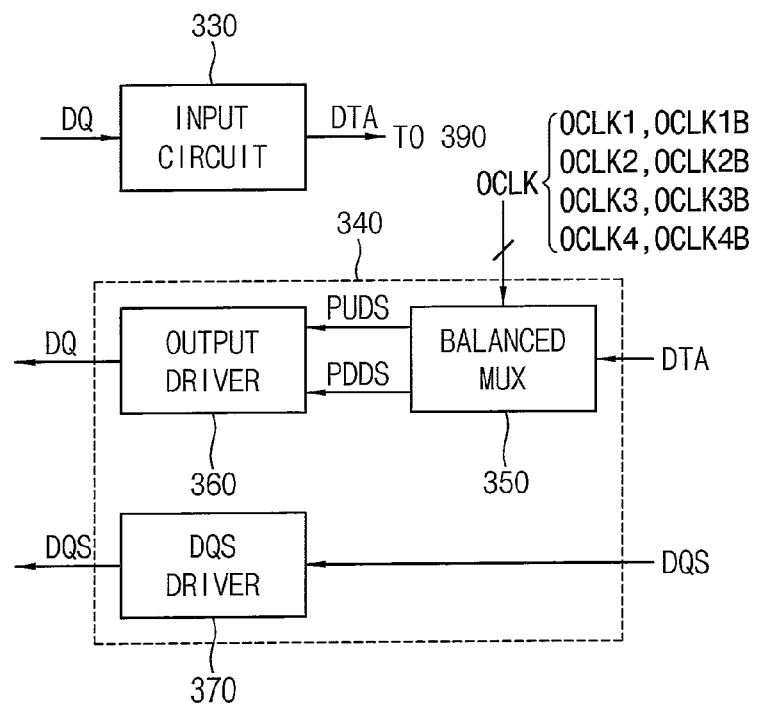
FIG. 5 illustrates an example of the data I/O buffer in the semiconductor memory device of FIG. 2 according to example embodiments.

FIG. 5 illustrates an example of the data I/O buffer in the semiconductor memory device of FIG. 2 according to example embodiments.

Referring to FIG. 5, the data I/O buffer 320 may include a data input circuit 330 and a data output circuit 340. The data output circuit 340 may include a balanced multiplexer 350, an output driver 360 and a strobe (DQS) driver 370.

The data input circuit 330 may receive the data signal DQ from the memory controller 100, may convert the data signal DQ to the data DTA, and may provide the data DTA to the ECC engine 390. The data output circuit 340 may convert data DTA from the ECC engine 390 to the data signal DQ and provide the data signal DQ to the memory controller 30.

The balanced multiplexer 350 may receive the data DTA and the output clock signal OCLK, may generate a pull-up driving signal PUDS and a pull-down driving signal PDDS based on the data DTA and the output clock signal OCLK, and may provide the pull-up driving signal PUDS and the pull-down driving signal PDDS to the output driver 360. The balanced multiplexer 350 may generate the pull-up driving signal PUDS and the pull-down driving signal PDDS by sampling the data DTA based on the output clock signal OCLK. The output clock signal OCLK may include first through fourth output clock signals pairs OCLK1 and OCLKB1, OCLK2 and OCLKB2, OCLK3 and OCLKB3 and OCLK4 and OCLKB4. Each of the first through fourth output clock signals pairs OCLK1 and OCLKB1, OCLK2 and OCLKB2, OCLK3 and OCLKB3 and OCLK4 and OCLKB4 may have a phase difference of 180 degrees with respect to each other.

For example, in one embodiment, when the data DTA is at a high level, the balanced multiplexer 350 generates the pull-up driving signal PUDS and the pull-down driving signal PDDS for turning off all transistors included in a pull-down driver (such as a pull-down driver 363 shown in FIG. 6) of the output driver 360. Contrarily, when the data DTA is at a low level, the balanced multiplexer 350 may generate the pull-down driving signal PDDS and the pull-up driving signal PUDS for turning off all transistors included in a pull-up driver (such as a pull-up driver 361 shown in FIG. 6) of the output driver 360.

Figure 6:
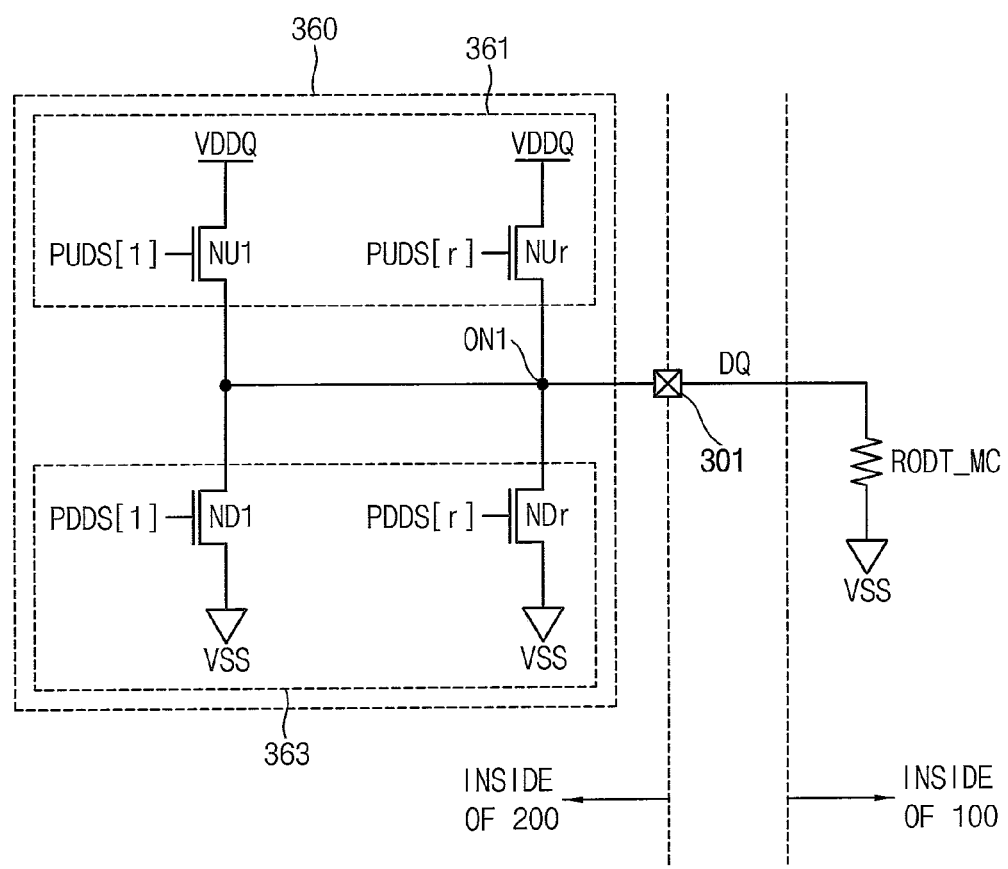
FIG. 6 illustrates a circuit diagram of an output driver in the data I/O buffer in FIG. 5 according to example embodiments.

FIG. 6 illustrates a circuit diagram of an output driver in the data I/O buffer in FIG. 5 according to example embodiments.

Referring to FIG. 6, the output driver 360 may include the pull-up driver 361 and the pull-down driver 363.

The pull-up driver 361 may include first through r-th (r is a natural number greater than one) pull-up transistors NU1 through NUr connected between the power supply voltage VDDQ and an output node ON1. Each of the first through r-th pull-up transistors NU1 through NUr may be an n-channel metal oxide semiconductor (NMOS) transistor. The pull-down driver 363 may include first through r-th pull-down transistors ND1 through NDr connected between the output node ON1 and a ground voltage VSS. Each of the first through r-th pull-down transistors ND1 through NDr may be an NMOS transistor.

When the data DTA is at the high level, the pull-up driver 361 may receive the pull-up driving signal PUDS (e.g., PUDS[1] through PUDS[r]) corresponding to the pull-up control code PUCD from the pre-driver 350 and generate the current determined by the pull-up control code PUCD. The pull-down transistors ND1 through NDr included in the pull-down driver 363 may all be turned off according to the pull-down driving signal PDDS (e.g., PDDS[1] through PDDS[r]).

At this time, when the data DTA is at the high level, the current generated by the pull-up driver 361 may be transmitted to an on-die termination (ODT) resistor RODT_MC in the memory controller 100 via the data I/O (or DQ) pad 301. The data signal DQ that the ODT resistor RODT_MC receives is determined by the current generated by the pull-up driver 361 and the ODT resistor RODT_MC.

When the data DTA is at the low level, the pull-up transistors NU1 through NUr included in the pull-up driver 361 may all be turned off according to the pull-up driving signal PUDS. The pull-down driver 363 may receive the pull-down driving signal PDDS corresponding to the pull-down control code PDCD from the data input circuit 330 (also described as a pre-driver) and may have a resistance determined by the pull-down control code PDCD.

At this time, when the data DTA is at the low level, no current is generated by the pull-up driver 361, and therefore, the data signal DQ that the ODT resistor RODT_MC receives has an output low level voltage (VOL) voltage which is substantially the same as the ground voltage VSS.

According to example embodiments, the total resistance, e.g., a termination resistance (RTT), of the pull-up driver 361 or the pull-down driver 363 may be changed in response to a particular pull-up or pull-down driving signal PUDS or PDDS.

Figure 7:
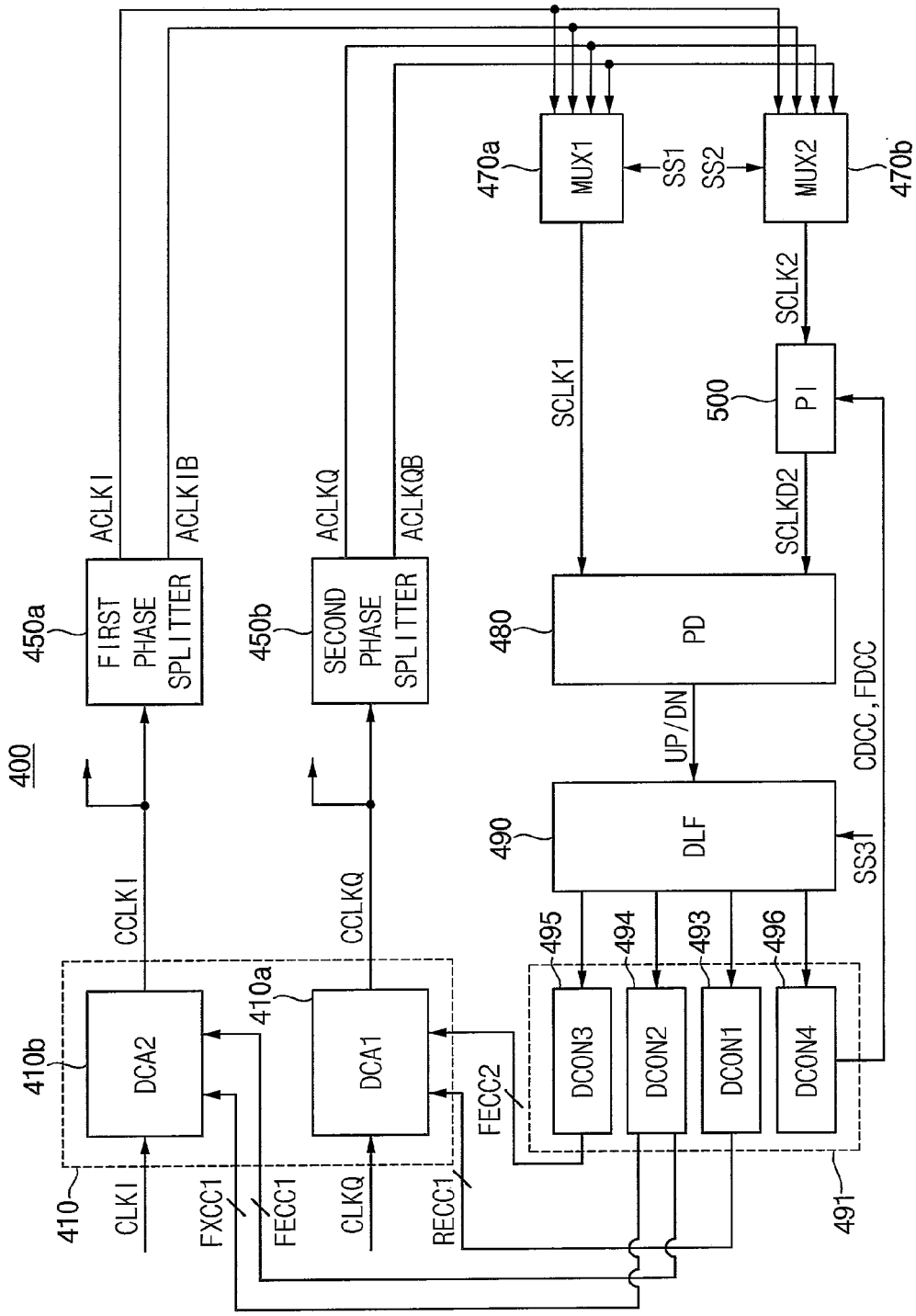
FIG. 7 is a block diagram illustrating an example of the quadrature error correction circuit in the semiconductor memory device of FIG. 2 according to example embodiments.

FIG. 7 is a block diagram illustrating an example of the quadrature error correction circuit in the semiconductor memory device of FIG. 2 according to example embodiments.

Referring to FIG. 7, the quadrature error correction circuit 400 may include a duty cycle adjusting circuit 410, a first phase splitter 450a, a second phase splitter 450b, a first multiplexer (MUX1) 470a, a second multiplexer (MUX2) 470b, a phase interpolator (PI) 500, a phase detector (PD) 480, a digital loop filter 490 and a delay control circuit 491.

The delay control circuit 491 may include a first delay controller DCON1 493, a second delay controller DCON2 494, a third delay controller DCON3 495 and a fourth delay controller DCON4 496.

The duty cycle adjusting circuit 410 may receive the first clock signal CLKI and the second clock signal CLKQ and may generate a first corrected clock signal CCLKI and a second corrected clock signal CCLKQ which have a phase difference of 90 degrees with respect to each other and whose skew and duty error are concurrently adjusted by adjusting a delay of a rising edge of the second clock signal with respect to a rising edge of the first clock signal, adjusting a delay of a falling edge of the first clock signal with respect to the adjusted rising edge of the second clock signal and adjusting a delay of a falling edge of the second clock signal with respect to the adjusted falling edge of the first clock signal, based on a first control code set RECC1, a second control code set FECC1, a third control code set FECC2 and a fixed control code set FXCC1.

The duty cycle adjusting circuit 410 may include a first duty cycle adjuster (DCA1) 410a and a second duty cycle adjuster (DCA2) 410b, also described as a first duty cycle adjuster circuit and second duty cycle adjuster circuit.

The first duty cycle adjuster 410a may generate the second corrected clock signal CCLKQ by adjusting the delay of the rising edge of the second clock signal CLKQ based on the first control code set RECC1 and by adjusting the delay of the falling edge of the second clock signal CLKQ based on the third control code set FECC2 and may provide the second corrected clock signal CCLKQ to the second phase splitter 450*b*. The second duty cycle adjuster 410*b* may generate the first corrected clock signal CCLKI by adjusting the delay of the rising edge of the first clock signal CLKI based on the fixed control code set FXCC1 and by adjusting the delay of the falling edge of the first clock signal CLKI based on the second control code set FECC1 and may provide the first corrected clock signal CCLKI to the first phase splitter 450*a*.

The first phase splitter 450*a* may split a phase of the first corrected clock signal CCLKI to output a first adjusted clock signal ACLKI and a third adjusted clock signal ACLKIB having a phase difference of 180 degrees with respect to each other and may provide the first adjusted clock signal ACLKI and the third adjusted clock signal ACLKIB to the first multiplexer 470*a* and the second multiplexer 470*b*. The second phase splitter 450*b* may split a phase of the second corrected clock signal CCLKQ to output a second adjusted clock signal ACLKQ and a fourth adjusted clock signal ACLKQB having a phase difference of 180 degrees with respect to each other and may provide the second adjusted clock signal ACLKQ and the fourth adjusted clock signal ACLKQB to the first multiplexer 470*a* and the second multiplexer 470*b*.

The first multiplexer 470*a* may receive the first through fourth adjusted clock signals ACLKI, ACLKQ, ACLKIB and ACLKQB and may select a first one of the first through fourth adjusted clock signals ACLKI, ACLKQ, ACLKIB and ACLKQB as a first selected clock signal SCLK1 based on a first selection signal SS1. The second multiplexer 470*b* may receive the first through fourth adjusted clock signals ACLKI, ACLKQ, ACLKIB and ACLKQB and may select a second one of the first through fourth adjusted clock signals ACLKI, ACLKQ, ACLKIB and ACLKQB as a second selected clock signal SCLK2 based on the second selection signal SS2. The second selected clock signal SCLK2 may have a phase lead of 90 degrees with respect to the first selected clock signal SCLK1.

For example, when the first multiplexer 470*a* selects the second adjusted clock signal ACLKQ as the first selected clock signal SCLK1, the second multiplexer 470*b* may select the first adjusted clock signal ACLKI as the second selected clock signal SCLK2.

The phase interpolator 500 may generate a second delayed and selected clock signal SCLKD2 by delaying the second selected clock signal SCLK2 based on a fourth control code set CDCC and FDCC. The phase interpolator 500 may generate the second delayed and selected clock signal SCLKD2 by delaying a phase of the second selected clock signal SCLK2 by 90 degrees. The fourth control code set CDCC and FDCC may include a first sub control code set CDCC and a second sub control code set FDCC.

The phase detector 480 may detect a phase difference between the first selected clock signal SCLK1 and the second delayed and selected clock signal SCLKD2, may generate an up/down signal UP/DN based on the detected phase difference and may provide the up/down signal UP/DN to the digital loop filter 490.

For example, when the first multiplexer 470*a* selects the second adjusted clock signal ACLKQ as the first selected clock signal SCLK1, the second multiplexer 470*b* may select the first adjusted clock signal ACLKI as the second selected clock signal SCLK2 and a skew and a duty error do not occur between the first corrected clock signal CCLKI and the second corrected clock signal CCLKQ, a phase of the second delayed and selected clock signal SCLKD2 may be the same as a phase of the second adjusted clock signal ACLKQ. When the phase of the second delayed and selected clock signal SCLKD2 is not same as the phase of the second adjusted clock signal ACLKQ, at least one of the skew and the duty error occurs between the first corrected clock signal CCLKI and the second corrected clock signal CCLKQ.

The digital loop filter 490 may filter the up/down signal UP/DN and in response to a third selection signal, may provide the filtered up/down signal to the fourth delay controller 496 and one of the first through third delay controllers 493, 494 and 495, which is associated with the first selected clock signal SCLK1. In this case, the associated one is the first delay controller 493.

The first delay controller 493 may adjust code values of the first control code set RECC1 based on the up/down signal UP/DN to provide the first control code set RECC1 to the first duty cycle adjuster 410*a*. The first duty cycle adjuster 410*a* may generate the second corrected clock signal CCLKQ by adjusting the delay of the rising edge of the second clock signal CLKQ based on the first control code set RECC1. When the delay of the rising edge of the second clock signal CLKQ is adjusted, a delay of a rising edge of the second adjusted clock signal ACLKQ and a delay of a falling edge of the fourth adjusted clock signal ACLKQB are adjusted.

The first multiplexer 470*a* selects the first adjusted clock signal ACLKI as the first selected clock signal SCLK1 in response to the first selection signal SS1, the second multiplexer 470*b* selects the fourth adjusted clock signal ACLKQB as the second selected clock signal SCLK2, the second delay controller 494 may adjust code values of the second control code set FECC1 based on the up/down signal UP/DN to provide the second control code set FECC1 to the second duty cycle adjuster 410*b*. The second duty cycle adjuster 410*b* may generate the first corrected clock signal CCLKI by fixing the delay of the rising edge of the first clock signal CLKI based on the fixed control code set FXCC and by adjusting the delay of the falling edge of the first clock signal CLKI based on the second control code set FECC1. When the delay of the falling edge of the first clock signal CLKI is adjusted, a delay of a falling edge of the first adjusted clock signal ACLKI and a delay of a rising edge of the third adjusted clock signal ACLKIB are adjusted.

While these processes are repeated, the duty cycle adjusting circuit 410 may output the first corrected clock signal CCLKI and the second corrected clock signal CCLKQ by concurrently adjusting the skew and duty error between the first clock signal CLKI and the second clock signal CLKQ.

In example embodiments, a binary to thermometer code converter may be disposed between the delay control circuit 491 and the duty cycle adjusting circuit 410. The binary to thermometer code converter may convert the first through third control code sets RECC1, FECC1 and RECC2 and the fixed control code set FXCC1 to thermometer codes to provide the thermometer codes to the first duty cycle adjuster 410*a* and the second duty cycle adjuster 410*b*.

The first selection signal SS1, the second selection signal SS2 and the third selection signal SS3 may be included in the second control signal CTL2 in FIG. 2.

Figure 8A:
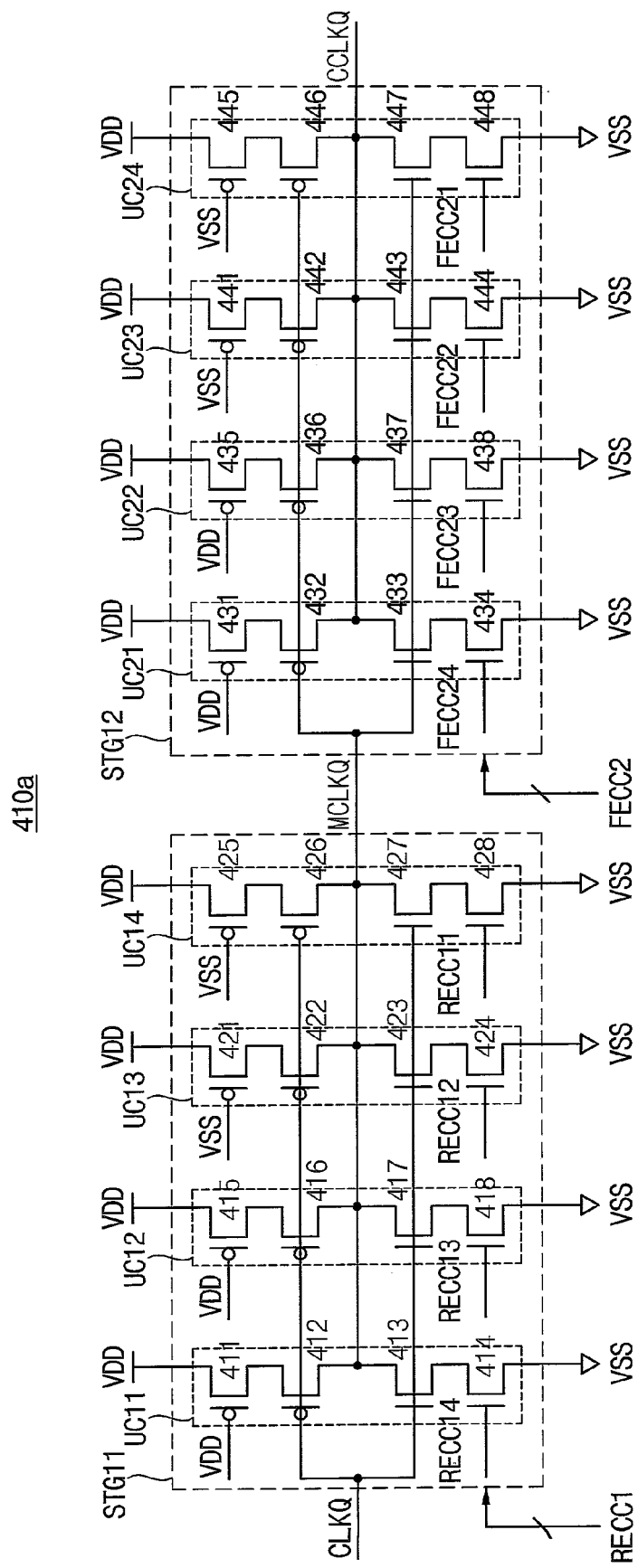
FIG. 8A is a circuit diagram illustrating an example of the first duty cycle adjuster in the quadrature error correction circuit of FIG. 7 according to example embodiments.

FIG. 8A is a circuit diagram illustrating an example of the first duty cycle adjuster in the quadrature error correction circuit of FIG. 7 according to example embodiments.

Referring to FIG. 8A, the first duty cycle adjuster 410*a* may include a first stage STG11 and a second stage STG12.

The first stage STG11 may provide a first intermediate clock signal MCLKQ by adjusting the delay of the rising edge of the second clock signal CLKQ based on the first control code set RECC1. The second stage STG12 may provide the second corrected clock signal CCLKQ by adjusting the delay of the falling edge of the first intermediate clock signal MCLKQ based on the third control code set FECC2.

The first stage STG11 may include a plurality of first unit cells UC11, UC12, UC13 and UC14 which are cascade-connected. The unit cell UC11 may include a first p-channel metal-oxide semiconductor (PMOS) transistor 411, a second PMOS transistor 412, a first n-channel metal-oxide semiconductor (NMOS) transistor 413 and a second NMOS transistor 414 which are connected in series between a power supply voltage VDD and a ground voltage VSS. The unit cell UC12 may include a first PMOS transistor 415, a second PMOS transistor 416, a first NMOS transistor 417 and a second NMOS transistor 418 which are connected in series between the power supply voltage VDD and the ground voltage VSS. The unit cell UC13 may include a first PMOS transistor 421, a second PMOS transistor 422, a first NMOS transistor 423 and a second NMOS transistor 424 which are connected in series between the power supply voltage VDD and the ground voltage VSS. The unit cell UC14 may include a first PMOS transistor 425, a second PMOS transistor 426, a first NMOS transistor 427 and a second NMOS transistor 428 which are connected in series between the power supply voltage VDD and the ground voltage VSS.

Each gate of the second PMOS transistors 412, 416, 422 and 426 and each gate of the first NMOS transistors 413, 417, 423 and 427 may receive the second clock signal CLKQ. Each gate of the first PMOS transistors 411 and 415 may be coupled to the power supply voltage VDD and each gate of the first PMOS transistors 421 and 425 may be coupled to the ground voltage VSS. Each gate of the second NMOS transistors 414, 418, 424 and 428 may receive respective one of bits RECC14, RECC13, RECC12 and RECC11 of the first control code set RECC1.

The second stage STG12 may include a plurality of second unit cells UC21, UC22, UC23 and UC24 which are cascade-connected. The unit cell UC21 may include a first PMOS transistor 431, a second PMOS transistor 432, a first NMOS transistor 433 and a second NMOS transistor 434 which are connected in series between the power supply voltage VDD and the ground voltage VSS. The unit cell UC22 may include a first PMOS transistor 435, a second PMOS transistor 436, a first NMOS transistor 437 and a second NMOS transistor 438 which are connected in series between the power supply voltage VDD and the ground voltage VSS. The unit cell UC23 may include a first PMOS transistor 441, a second PMOS transistor 442, a first NMOS transistor 443 and a second NMOS transistor 444 which are connected in series between the power supply voltage VDD and the ground voltage VSS. The unit cell UC24 may include a first PMOS transistor 445, a second PMOS transistor 446, a first NMOS transistor 447 and a second NMOS transistor 448 which are connected in series between the power supply voltage VDD and the ground voltage VSS.

Each gate of the second PMOS transistors 432, 436, 442 and 446 and each gate of the first NMOS transistors 433, 437, 443 and 447 may receive the first intermediate clock signal MCLKQ. Each gate of the first PMOS transistors 431 and 435 may be coupled to the power supply voltage VDD and each gate of the first PMOS transistors 441 and 445 may be coupled to the ground voltage VSS. Each gate of the second NMOS transistors 434, 438, 444 and 448 may receive respective one of bits FECC24, FECC23, FECC22 and FECC21 of the third control code set FECC2.

Therefore, the first unit cells UC11, UC12, UC13 and UC14 of the first stage STG11 may provide the first intermediate clock signal MCLKQ by adjusting the delay of the rising edge of the second clock signal CLKQ based on the bits RECC14, RECC13, RECC12 and RECC11 of the first control code set RECC1 and the second unit cells UC21, UC22, UC23 and UC24 of the second stage STG12 may provide the second corrected clock signal CCLKQ by adjusting the delay of the falling edge of the first intermediate clock signal MCLKQ based on the bits FECC24, FECC23, FECC22 and FECC21 of the third control code set FECC2.

Figure 8B:
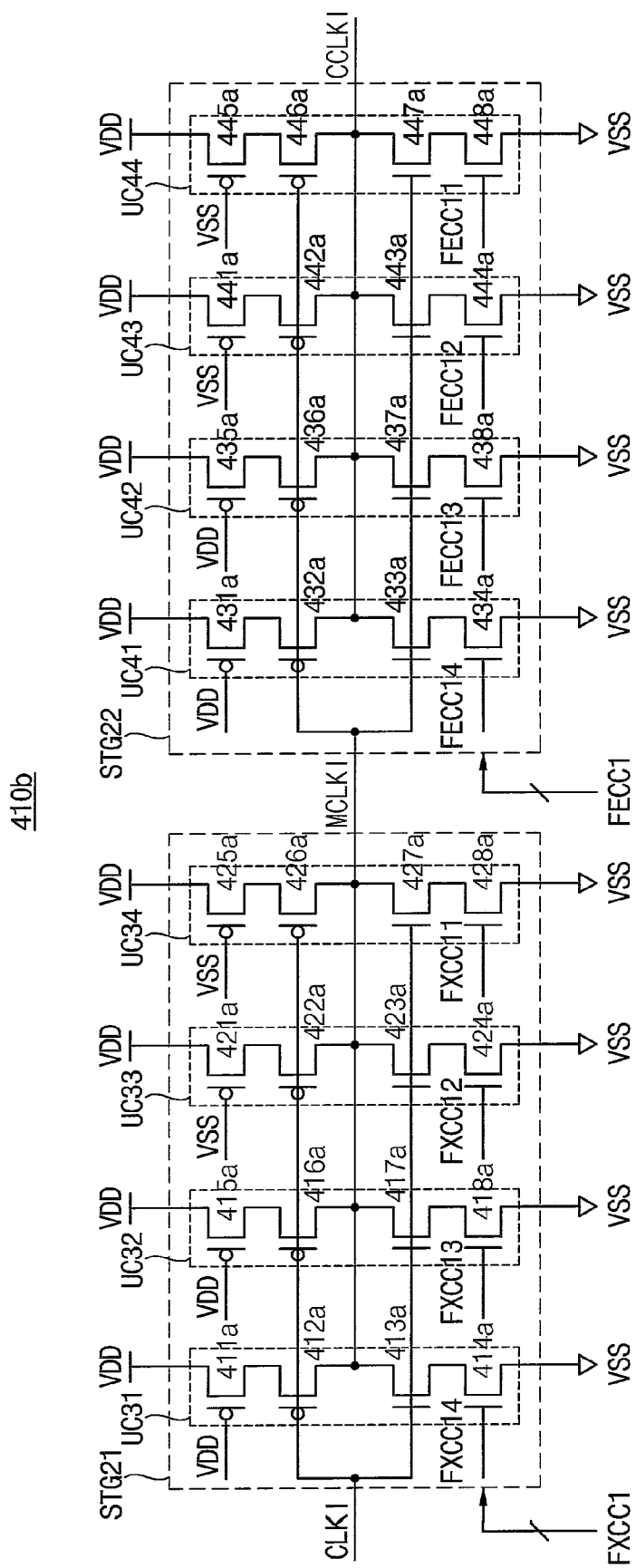
FIG. 8B is a circuit diagram illustrating an example of the second duty cycle adjuster in the quadrature error correction circuit of FIG. 7 according to example embodiments.

FIG. 8B is a circuit diagram illustrating an example of the second duty cycle adjuster in the quadrature error correction circuit of FIG. 7 according to example embodiments.

Referring to FIG. 8B, the second duty cycle adjuster 410b may include a first stage STG21 and a second stage STG22.

The first stage STG21 may provide a second intermediate clock signal MCLKI by fixing the delay of the rising edge of the first clock signal CLKI based on the fixed control code set FXCC1. The second stage STG22 may provide the first corrected clock signal CCLKI by adjusting the delay of the falling edge of the second intermediate clock signal MCLKI based on the second control code set FECC1.

The first stage STG21 may include a plurality of first unit cells UC31, UC32, UC33 and UC34 which are cascade-connected. The unit cell UC31 may include a first PMOS transistor 411a, a second PMOS transistor 412a, a first NMOS transistor 413a and a second NMOS transistor 414a which are connected in series between the power supply voltage VDD and the ground voltage VSS. The unit cell UC32 may include a first PMOS transistor 415a, a second PMOS transistor 416a, a first NMOS transistor 417a and a second NMOS transistor 418a which are connected in series between the power supply voltage VDD and the ground voltage VSS. The unit cell UC33 may include a first PMOS transistor 421a, a second PMOS transistor 422a, a first NMOS transistor 423a and a second NMOS transistor 424a which are connected in series between the power supply voltage VDD and the ground voltage VSS. The unit cell UC34 may include a first PMOS transistor 425a, a second PMOS transistor 426a, a first NMOS transistor 427a and a second NMOS transistor 428a which are connected in series between the power supply voltage VDD and the ground voltage VSS.

Each gate of the second PMOS transistors 412a, 416a, 422a and 426a and each gate of the first NMOS transistors 413a, 417a, 423a and 427a may receive the first clock signal CLKI. Each gate of the first PMOS transistors 411a and 415a may be coupled to the power supply voltage VDD and each gate of the first PMOS transistors 421a and 425a may be coupled to the ground voltage VSS. Each gate of the second NMOS transistors 414a, 418a, 424a and 428a may receive respective one of bits FXCC14, FXCC13, FXCC12 and FXCC11 of the fixed control code set FXCC1.

The second stage STG22 may include a plurality of second unit cells UC41, UC42, UC43 and UC44 which are cascade-connected. The unit cell UC41 may include a first PMOS transistor 431a, a second PMOS transistor 432a, a first NMOS transistor 433a and a second NMOS transistor 434a which are connected in series between the power supply voltage VDD and the ground voltage VSS. The unit cell UC42 may include a first PMOS transistor 435a, a second PMOS transistor 436a, a first NMOS transistor 437a and a second NMOS transistor 438a which are connected in series between the power supply voltage VDD and the ground voltage VSS. The unit cell UC43 may include a first PMOS transistor 441a, a second PMOS transistor 442a, a first NMOS transistor 443a and a second NMOS transistor 444a which are connected in series between the power supply voltage VDD and the ground voltage VSS. The unit cell UC44 may include a first PMOS transistor 445a, a second PMOS transistor 446a, a first NMOS transistor 447a and a second NMOS transistor 448a which are connected in series between the power supply voltage VDD and the ground voltage VSS.

Each gate of the second PMOS transistors 432a, 436a, 442a and 446a and each gate of the first NMOS transistors 433a, 437a, 443a and 447a may receive the second intermediate clock signal MCLKI. Each gate of the first PMOS transistors 431a and 435a may be coupled to the power supply voltage VDD and each gate of the first PMOS transistors 441a and 445a may be coupled to the ground voltage VSS. Each gate of the second NMOS transistors 434a, 438a, 444a and 448a may receive respective one of bits FECC14, FECC13, FECC12 and FECC11 of the second control code set FECC1.

Therefore, the first unit cells UC31, UC32, UC33 and UC34 of the first stage STG21 may provide the second intermediate clock signal MCLKI by fixing the delay of the rising edge of the first clock signal CLKI based on the bits FXCC14, FXCC13, FXCC12 and FXCC11 of the fixed control code set FXCC1 and the second unit cells UC41, UC42, UC43 and UC44 of the second stage STG22 may provide the first corrected clock signal CCLKI by adjusting the delay of the falling edge of the second intermediate clock signal MCLKI based on the bits FECC14, FECC13, FECC12 and FECC11 of the second control code set FECC1.

Figure 9:
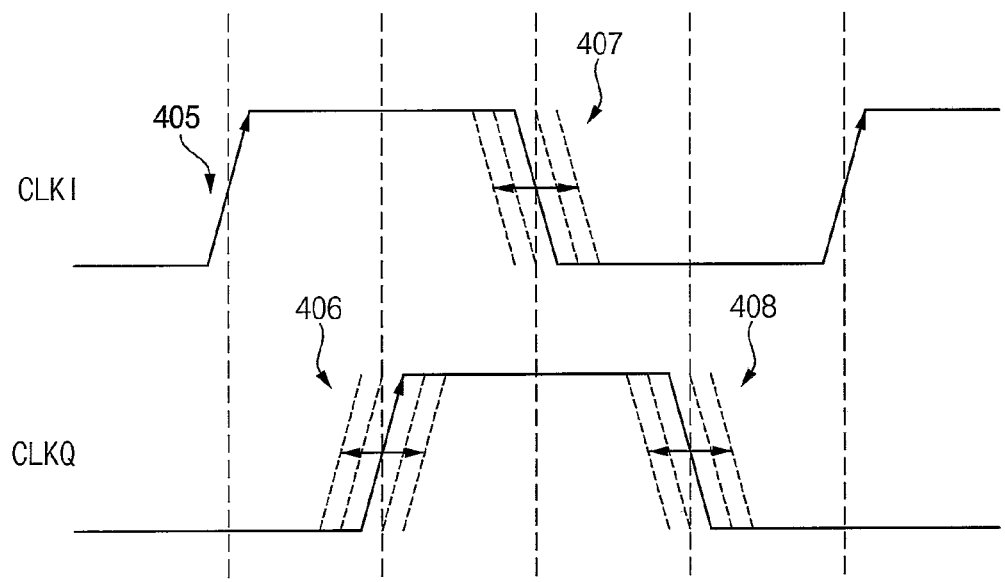
FIG. 9 illustrates an example operation of the quadrature error correction circuit of FIG. 7 according to example embodiments.

FIG. 9 illustrates an example operation of the quadrature error correction circuit of FIG. 7 according to example embodiments.

Referring to FIGS. 7 and 9, the duty cycle adjusting circuit 410 may concurrently adjust the skew between the first clock signal CLKI and the second clock signal CLKQ and the duty cycle error of each of the first clock signal CLKI and the second clock signal CLKQ by fixing the delay of the rising edge of the first clock signal CLKI based on the fixed control code set FXCC1 as a reference numeral 405 indicates, by adjusting the delay of the rising edge of the second clock signal CLKQ with respect to the (fixed) rising edge of the first clock signal CLKI based on the first control code set RECC1 as a reference numeral 406 indicates, by adjusting the delay of the falling edge of the first clock signal CLKI with respect to the adjusted rising edge of the second clock signal CLKQ based on the second control code set FECC1 as a reference numeral 407 indicates, and by adjusting the delay of the falling edge of the second clock signal CLKQ with respect to the adjusted falling edge of the first clock signal CLKI based on the third control code set FECC2 as a reference numeral 408 indicates.

Figure 10:
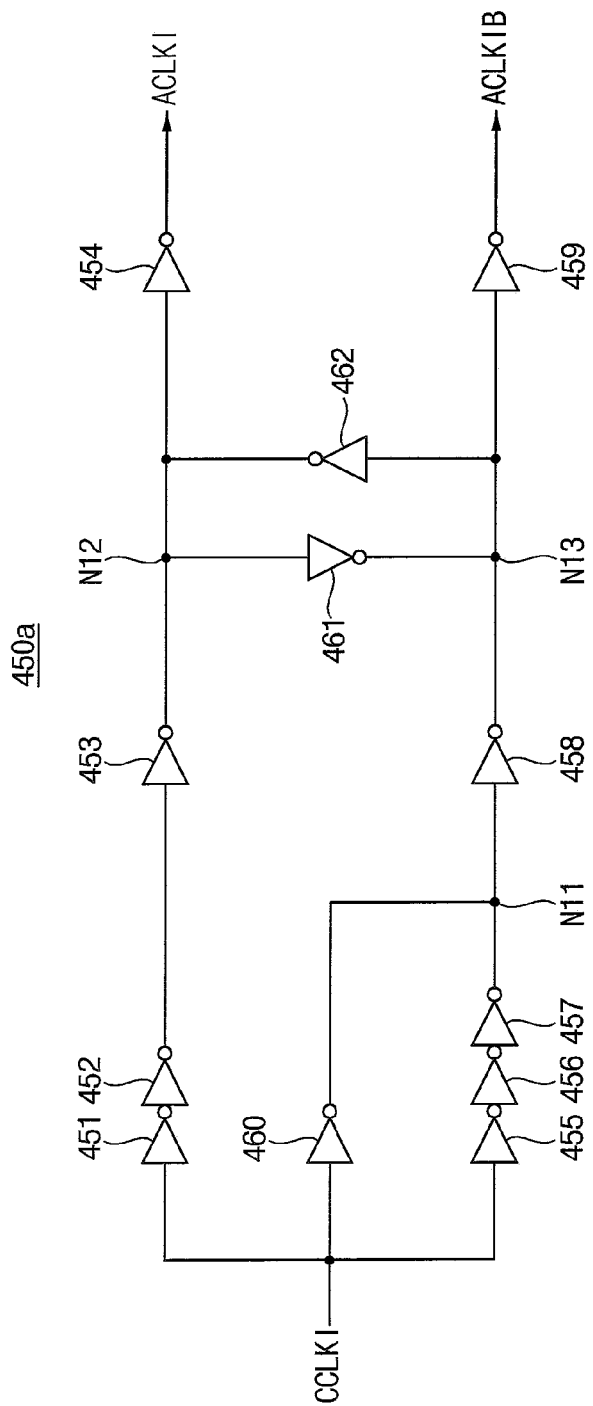
FIG. 10 is a circuit diagram illustrating an example of the first phase splitter in the quadrature error correction circuit of FIG. 7 according to example embodiments.

FIG. 10 is a circuit diagram illustrating an example of the first phase splitter in the quadrature error correction circuit of FIG. 7 according to example embodiments.

Referring to FIG. 10, the first phase splitter 450a may include a plurality of inverters 451~462.

The inverters 451, 452 and 453 invert the first corrected clock signal CCLKI three times to be provided to a node N12. The inverter 460 inverts the first corrected clock signal CCLKI to be provided to a node N11. The inverters 455, 456 and 457 invert the first corrected clock signal CCLKI three times to be provided to the node N11. The inverter 458 inverts a level of the node N11 to provide an inverted level to N31. The inverters 461 and 462 are coupled in a latch configuration between the node N12 and the node 13, and latch a level of the node N12 and a level of the node N13. The inverter 454 inverts a level of the node N12 to provide the first adjusted clock signal ACLKI. The inverter 459 inverts a level of the node N13 to provide the third adjusted clock signal ACLKIB.

A configuration of the second phase splitter 450b in FIG. 7 may be substantially the same as a configuration of the first phase splitter 450a of FIG. 10.

Figure 11:
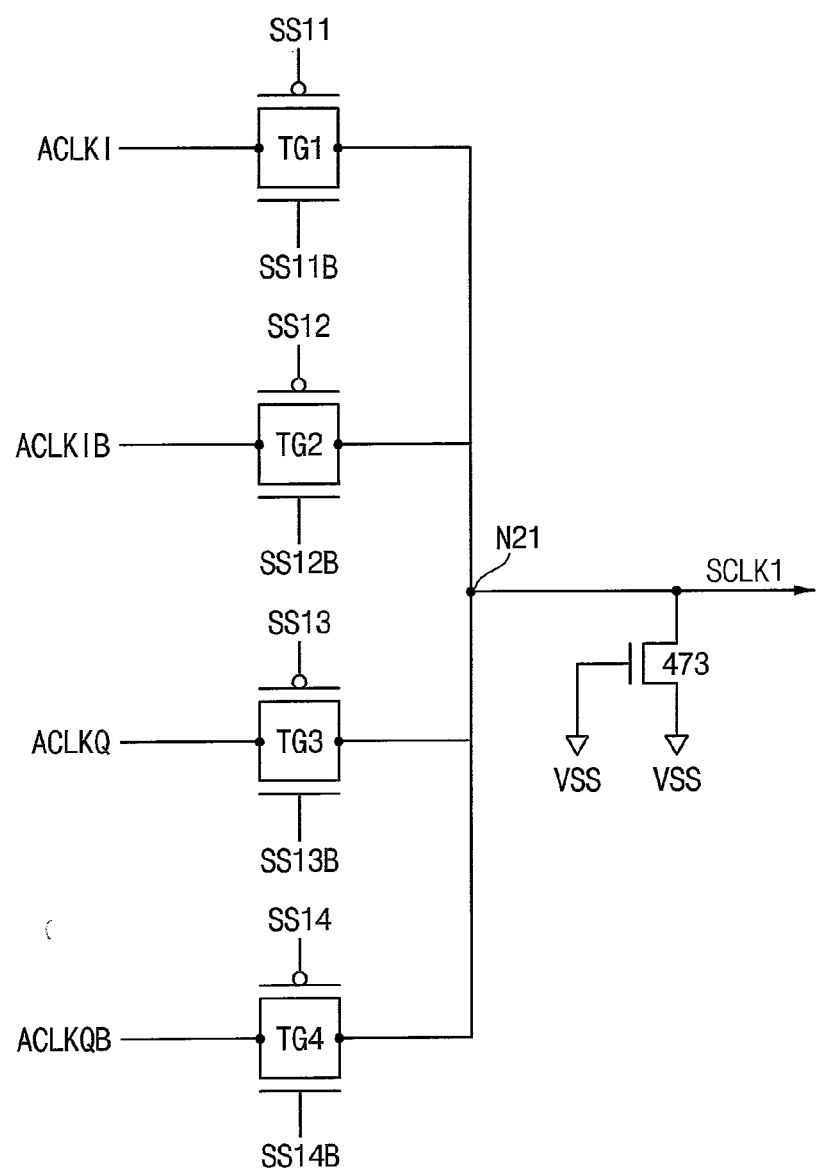
FIG. 11 is a circuit diagram illustrating an example of the first multiplexer in the quadrature error correction circuit of FIG. 7 according to example embodiments.

FIG. 11 is a circuit diagram illustrating an example of the first multiplexer in the quadrature error correction circuit of FIG. 7 according to example embodiments.

Referring to FIG. 11, the first multiplexer 470a may include first through fourth transmission gates TG1, TG2, TG3 and TG4 and an NMOS transistor 473. The first through fourth transmission gates TG1, TG2, TG3 and TG4 may be connected to a node N21 in parallel with respect to each other, may receive the first adjusted clock signal ACLKI, the third adjusted clock signal ACLKIB, the second adjusted clock signal ACLKQ and the fourth adjusted clock signal ACLKQB respectively, and may be selectively turned-on in response to selection bits SS11 and SS11b, SS12 and SS12b, SS13 and SS13B and SS14 and SS14B of the first selection signal SS1 respectively to provide one of the first adjusted clock signal ACLKI, the third adjusted clock signal ACLKIB, the second adjusted clock signal ACLKQ and the fourth adjusted clock signal ACLKQB as the first selected clock signal SCLK1. The NMOS transistor 473 may be connected between the node N21 and the ground voltage VSS and may have a gate coupled to the ground voltage VSS.

A configuration of the second multiplexer 470b in FIG. 7 may be substantially the same as a configuration of the first multiplexer 470a of FIG. 1.

Figure 12:
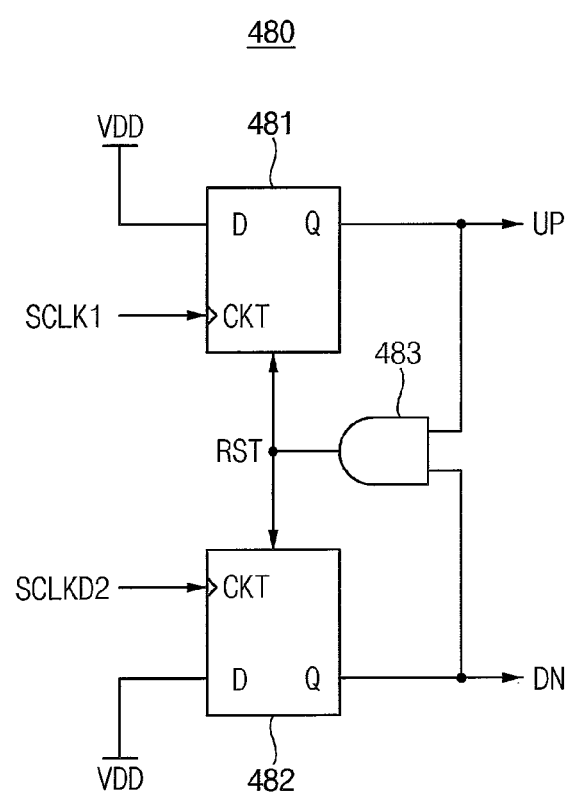
FIG. 12 is a circuit diagram illustrating an example of the phase detector in the quadrature error correction circuit of FIG. 7 according to example embodiments.

FIG. 12 is a circuit diagram illustrating an example of the phase detector in the quadrature error correction circuit of FIG. 7 according to example embodiments.

Referring to FIG. 12, the phase detector 480 may include a first flip-flop 481, a second flip-flop 482 and an AND gate 483.

The first flip-flop 481 may be synchronized with the first selected clock signal SCLK1. Similarly, the second flip-flop 482 may be synchronized with the second delayed and selected clock signal SCLKD2. A data input D of each of the first and second flip-flops 481 and 482 may be connected to the power supply voltage VDD. That is, the data input D may be connected to a logic "1". The first flip-flop 481 may output an output Q as logic "1" at a rising edge of the first selected clock signal SCLK1. Similarly, the second first flip-flop 482 may output an output Q as logic "1" at a rising edge of the second delayed and selected clock signal SCLKD2. The output Q of the first flip-flop 481 may become a first up signal UP1 and the output Q of the second flip-flop 482 may become a first down signal DN1.

The AND gate 483 performs an AND operation on the output Q of the first flip-flop 481 and the output Q of the second flip-flop 482 and may output a reset signal RST. The reset signal RST may be provided to the first and second flip-flops 481 and 482.

When a phase of the first selected clock signal SCLK1 is earlier than a phase of the second delayed and selected clock signal SCLKD2, the first up signal UP1 may become logic "1" from the rising edge of the first selected clock signal SCLK1 and may become logic "0" from the rising edge of the second delayed and selected clock signal SCLKD2. Similarly, when a phase of the second delayed and selected clock signal SCLKD2 is earlier than a phase of the first selected clock signal SCLK1, the first down signal DN1 may become logic "1" from the rising edge of the second delayed and selected clock signal SCLKD2 and may become logic "0" from the rising edge of the first selected clock signal SCLK1.

Figure 13:
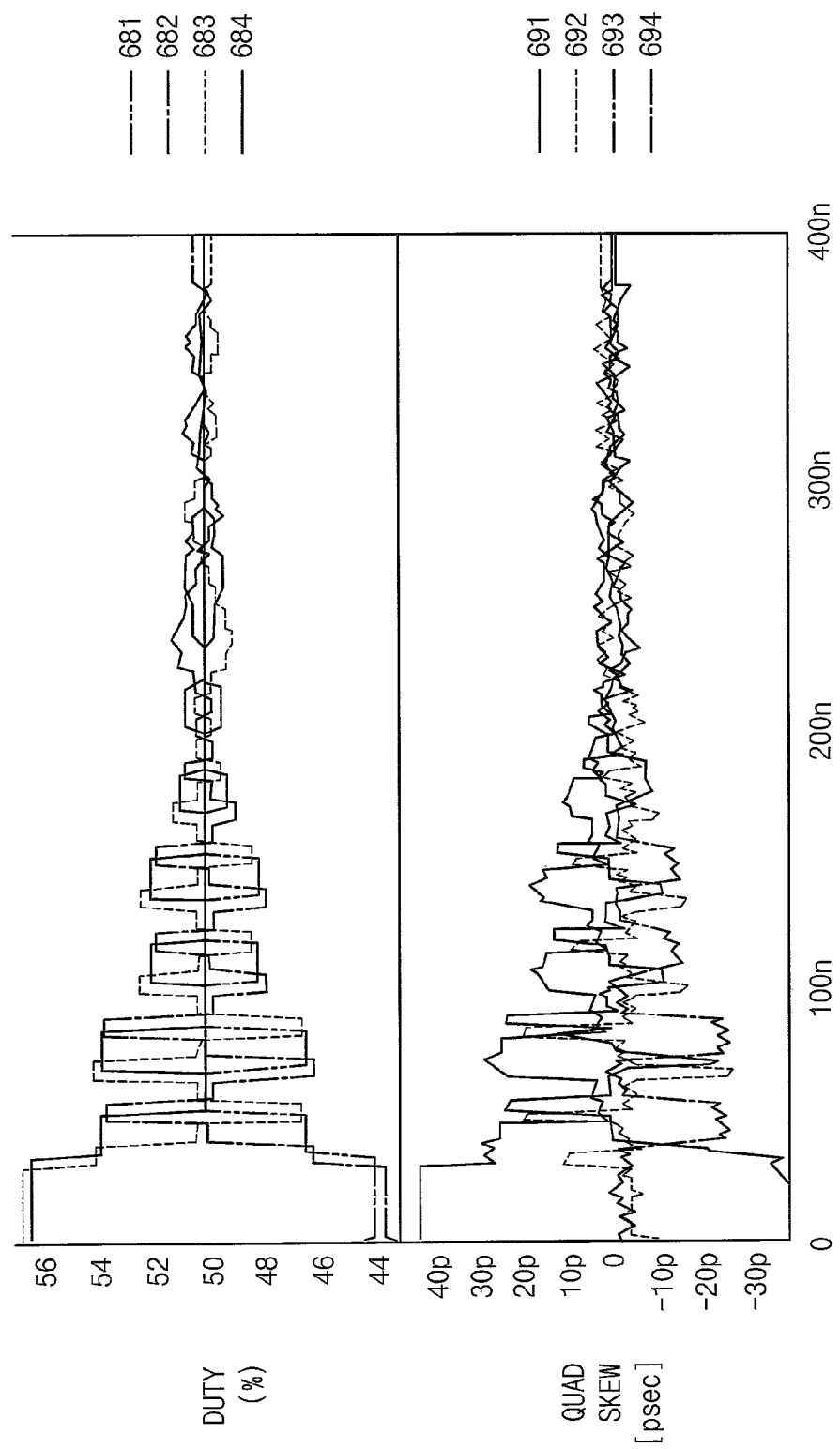
FIG. 13 illustrates a duty cycle of each of the first through fourth adjusted clock signals and a skew between two adjusted clock signals having a phase difference of 90 degrees from among the first through fourth adjusted clock signals.

FIG. 13 illustrates a duty cycle of each of the first through fourth adjusted clock signals and a skew between two adjusted clock signals having a phase difference of 90 degrees from among the first through fourth adjusted clock signals.

In FIG. 13, each of reference numerals 681, 682, 683 and 684 denotes a duty cycle of respective one of the first through fourth adjusted clock signals ACLKI, ACLKQ, ACLKIB and ACLKQB, a reference numeral 691 denotes a skew between the first and second adjusted clock signals ACLKI and ACLKQ, a reference numeral 692 denotes a skew between the second and third adjusted clock signals ACLKQ and ACLKIB, a reference numeral 693 denotes a skew between the third and fourth adjusted clock signals ACLKIB and ACLKQB and a reference numeral 694 denotes a skew between the fourth and first adjusted clock signals ACLKQB and ACLKI.

Referring to FIG. 13, it is noted that each duty cycle of the first through fourth adjusted clock signals ACLKI, ACLKQ, ACLKIB and ACLKQB converges to 50% within a target time interval and a skew between two adjusted clock signals having a phase difference of 90 degrees from among the first through fourth adjusted clock signals ACLKI, ACLKQ, ACLKIB and ACLKQB converges to a value within a target value. The x-axis in FIG. 13 denotes nanoseconds.

Figure 14:
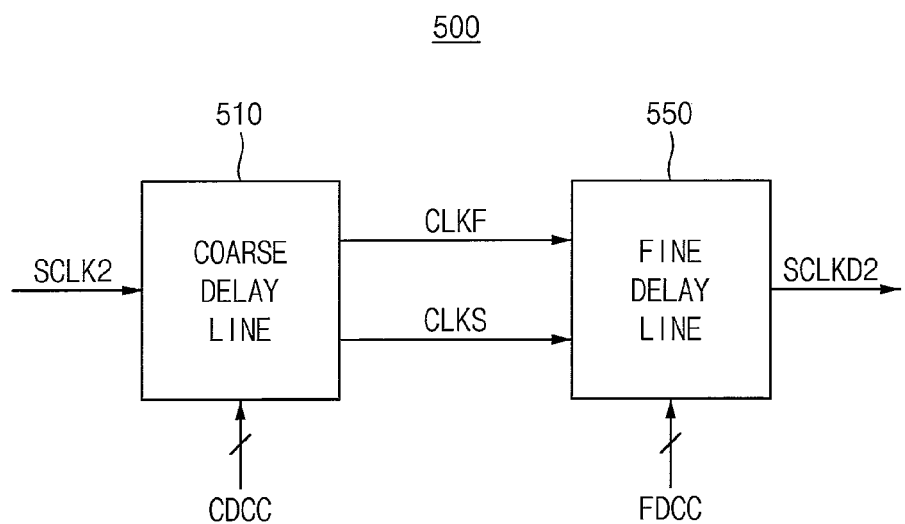
FIG. 14 is a block diagram illustrating an example of the phase interpolator in the quadrature error correction circuit of FIG. 7 according to example embodiments.

FIG. 14 is a block diagram illustrating an example of the phase interpolator in the quadrature error correction circuit of FIG. 7 according to example embodiments.

Referring to FIG. 14, the phase interpolator 500 may include a coarse delay line 510 and a fine delay line 550.

Hereinafter, the coarse delay line 510 will be referred to as a first delay circuit and the fine delay line 550 will be referred to as a second delay circuit.

The first delay circuit 510 may delay the second selected clock signal SCLK2 based on a first sub control code set CDCC to generate a first delayed clock signal CLKF and a second delayed clock signal CLKS. The second delay circuit 550 may interpolate phases of the first delayed clock CLKF signal and the second delayed clock signal CLKS based on a second sub control code set FDCC to generate the second delayed and selected clock signal SCLKD2. A phase of the second delayed and selected clock signal SCLKD2 may be delayed by 90 degrees with respect to the second selected clock signal SCLK2.

Figure 15:
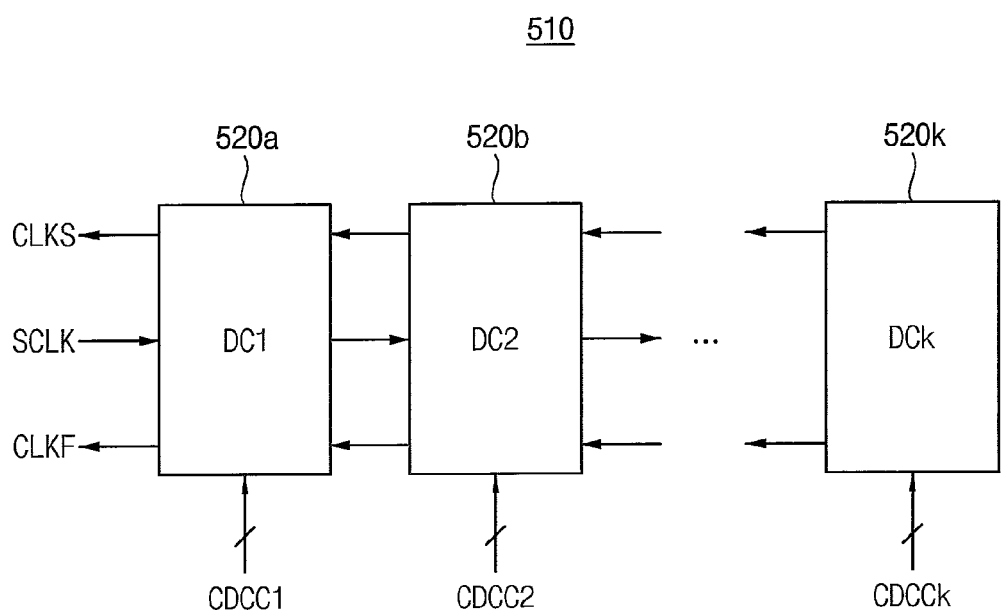
FIG. 15 is a block diagram illustrating an example of the first delay circuit in the phase interpolator of FIG. 14 according to example embodiments.

FIG. 15 is a block diagram illustrating an example of the first delay circuit in the phase interpolator of FIG. 14 according to example embodiments.

Referring to FIG. 15, the first delay circuit 510 may include a plurality of cascade-connected delay cells (DC1, DC2, ..., DCk) 520a, 520b, ..., 520k (k is a natural number equal to or greater than three). The plurality of cascade-connected delay cells 520a, 520b, ..., 520k may be referred to as first through k-th delay cells.

The plurality of delay cells 520a, 520b, ..., 520k may delay the second selected clock signal SCLK2 based on the first sub control code set to output the first delayed clock signal CLKF and the second delayed clock signal CLKS having a fixed delay amount.

The first delay cell 520a may receive a first control code CDCC1. The second delay cell 520b may receive a second control code CDCC2. The k-th delay cell 520k may receive a k-th control code CDCCk.

Figure 16:
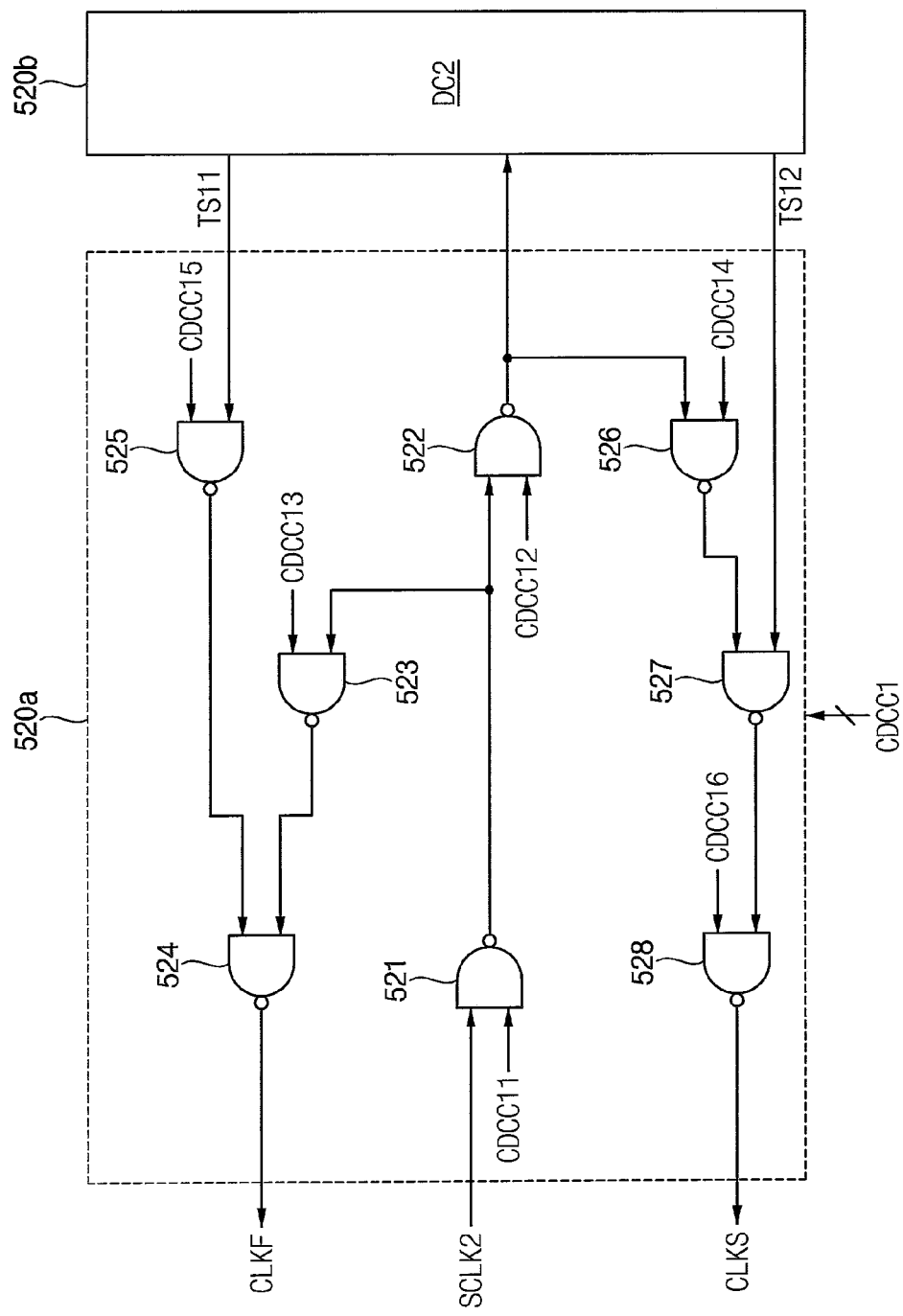
FIG. 16 is a circuit diagram illustrating an example of the first delay cell of the plurality of delay cells in FIG. 15 according to example embodiments.

FIG. 16 is a circuit diagram illustrating an example of the first delay cell of the plurality of delay cells in FIG. 15 according to example embodiments.

Each of the delay cells 520b, ..., 520k may have the same configuration as a configuration of the first delay cell 520a. That is, the plurality of delay cells 520a, 520b, ... 520k may have the same configuration with respect to one another.

Referring to FIG. 16, the first delay cell 520a may include a plurality of NAND gates 521~528.

The NAND gate 521 performs a NAND operation on the second selected clock signal SCLK2 and a first control bit CDCC11. The NAND gate 522 performs a NAND operation on an output of the NAND gate 521 and second control bit CDCC12. The NAND gate 523 performs a NAND operation on the output of the NAND gate 521 and a third control bit CDCC13. The NAND gate 525 performs a NAND operation on a transfer signal TS11 from the second delay cell 520b and a fifth control bit CDCC15. The NAND gate 524 performs a NAND operation on the output of the NAND gate 523 and an output of the NAND gate 525 to output the first delayed clock signal CLKF.

The NAND gate 526 performs a NAND operation on the output of the NAND gate 522 and a fourth control bit CDCC14. The NAND gate 527 performs a NAND operation on a transfer signal TS12 from the second delay cell 520b and the output of the NAND gate 252. The NAND gate 528 performs a NAND operation on the output of the NAND gate 527 and a sixth control bit CDCC16 to output the second delayed clock signal CLKS.

The second through fifth control bits CDCC12, CDCC13, CDCC14 and CDCC15 may determine delay amounts of the first delayed clock signal CLKF and the second delayed clock signal CLKS. The second delayed clock signal CLKS may be delayed by a delay amount corresponding to two NAND gates with respect to the first delayed clock signal CLKF.

Figure 17:
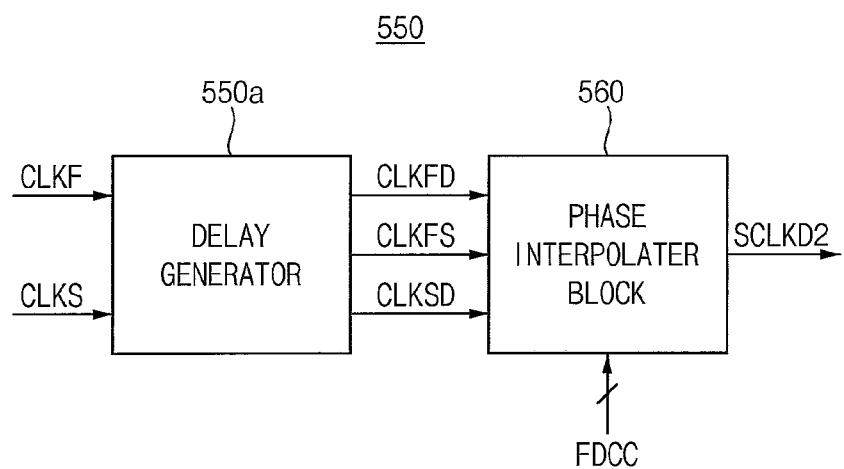
FIG. 17 is a block diagram illustrating an example of the second delay circuit in the phase interpolator of FIG. 14 according to example embodiments.

FIG. 17 is a block diagram illustrating an example of the second delay circuit in the phase interpolator of FIG. 14 according to example embodiments.

Referring to FIG. 17, the second delay circuit 550 may include a delayed clock signal generator 550a and a phase interpolator block 560.

The delayed clock signal generator 550a, also described as a delayed clock signal generator circuit, may delay the first delayed clock signal CLKF and the second delayed clock signal CLKS to generate first through third sub delayed clock signals CLKFD, CLKFS and CLKSD. The phase interpolator block 460 may finely adjust delay amounts of the first through third sub delayed clock signals CLKFD, CLKFS and CLKSD based on the second control code set FDCC to output the second delayed and selected clock signal SCLKD2. For example, the phase interpolator block 560 may divide each phase of the first through third sub delayed clock signals CLKFD, CLKFS and CLKSD, and may interpolate the divided phases to output the second delayed and selected clock signal SCLKD2, in response to the second sub control code set FDCC.

Figure 18:
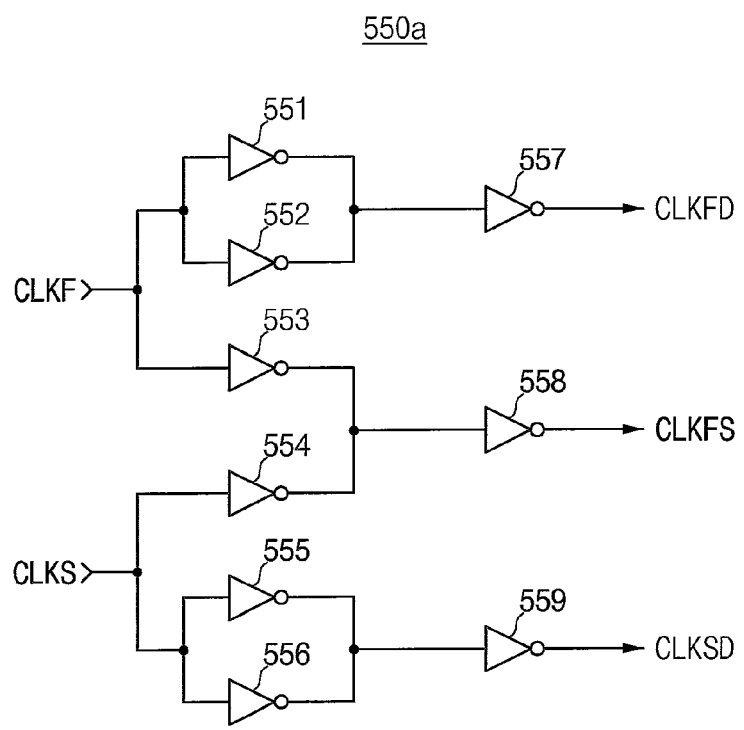
FIG. 18 is a block diagram illustrating an example of the delayed clock signal generator in the second delay circuit of FIG. 17 according to example embodiments.

FIG. 18 is a block diagram illustrating an example of the delayed clock signal generator in the second delay circuit of FIG. 17 according to example embodiments.

Referring to FIG. 18, the delayed clock signal generator 550a may include a plurality of inverters 551~559.

Each of the inverters 551, 552 and 553 inverts the first delayed clock signal CLKF. Each of the inverters 554, 555 and 556 inverts the second delayed clock signal CLKS. The inverter 557 inverts outputs of the inverters 551 and 552 to output the first sub delayed clock signal CLKFD. The inverter 558 inverts outputs of the inverters 553 and 554 to output the second sub delayed clock signal CLKFS. The inverter 559 inverts outputs of the inverters 555 and 556 to output the third sub delayed clock signal CLKSD.

Therefore, the first sub delayed clock signal CLKFD is delayed by a delay amount of two inverters with respect to the first delayed clock signal CLKF, the second sub delayed clock signal CLKFS is delayed by a delay amount correspond to sum of a delay amount of two inverters and a delay amount between the first delayed clock signal CLKF and the second delayed clock signal CLKS with respect to the first delayed clock signal CLKF, and the third sub delayed clock signal CLKSD is delayed by a delay amount of two inverters with respect to the second delayed clock signal CLKS.

Figure 19:
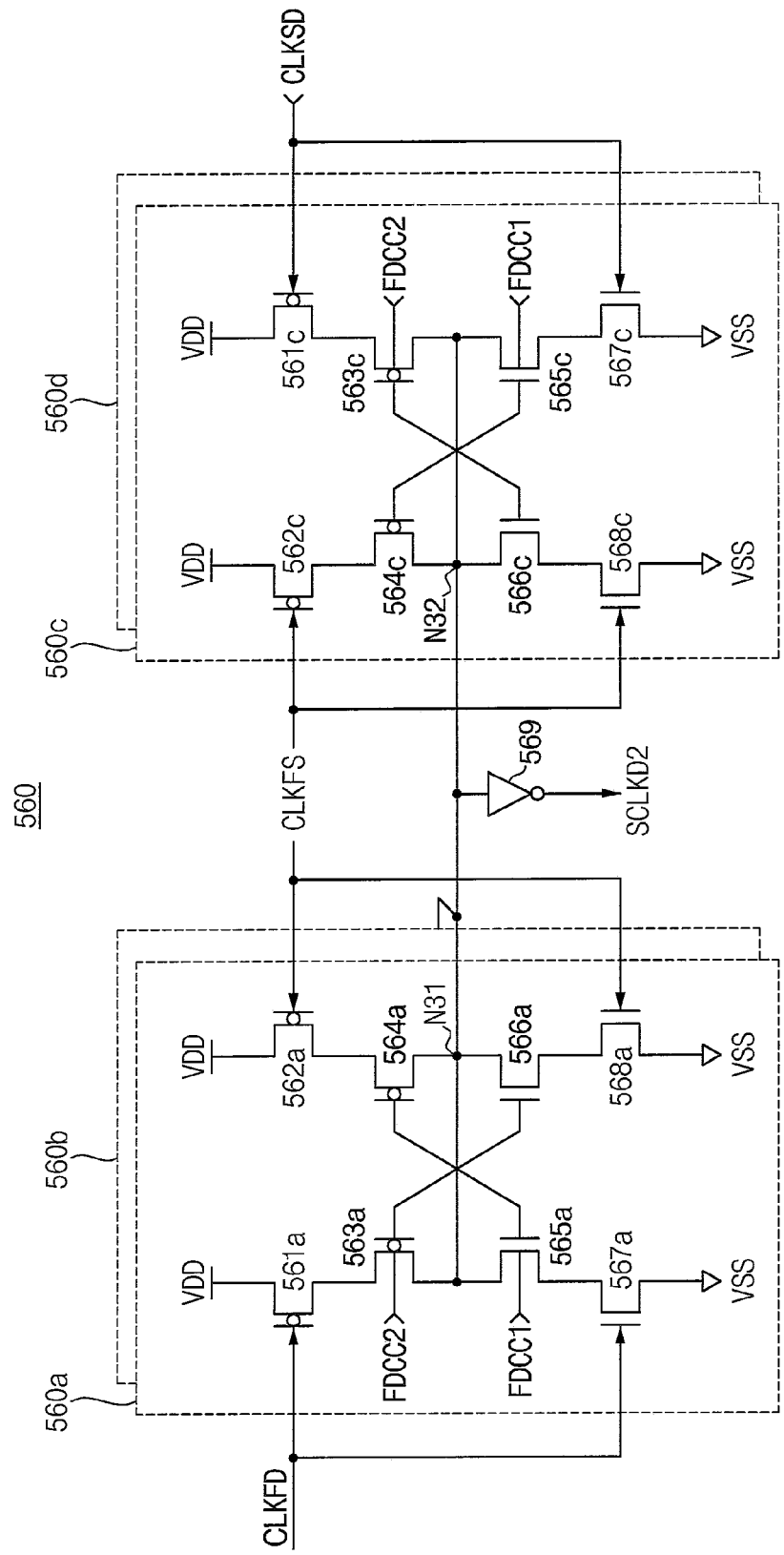
FIG. 19 is a block diagram illustrating an example of the phase interpolator block in the second delay circuit of FIG. 17 according to example embodiments.

FIG. 19 is a block diagram illustrating an example of the phase interpolator block in the second delay circuit of FIG. 17 according to example embodiments.

Referring to FIG. 19, the phase interpolator block 560 may include a plurality of phase interpolators 560a, 560b, 560c and 560d and an inverter 569. The phase interpolator block 560 may be described as a phase interpolator block circuit, and the phase interpolators 560a, 560b, 560c and 560d may be described as phase interpolator circuits.

The phase interpolator 560a may include PMOS transistors 561a-564a and NMOS transistors 565a-568a. The PMOS transistors 561a and 563a and the NMOS transistors 565a and 567a are cascade-connected between the power supply voltage VDD and the ground voltage VSS, and the PMOS transistors 562a and 564a and the NMOS transistors 566a and 568a are cascade-connected between the power supply voltage VDD and the ground voltage VSS.

Gates of the PMOS transistor 561a and the NMOS transistor 567a receive the first sub delayed clock signal CLKFD, gates of the PMOS transistor 562a and the NMOS transistor 568a receive the second sub delayed clock signal CLKFS, gates of the PMOS transistor 563a and the NMOS transistor 566a receive a second control bit FDCC2 of the second sub control code set FDCC and gates of the PMOS transistor 564a and the NMOS transistor 565a receive a first control bit FDCC1 of the second sub control code set FDCC. The PMOS transistor 564a and the NMOS transistor 566a may be connected to each other at a node N31.

A configuration of the phase interpolator 560b may be the same as a configuration of the phase interpolator 560a.

The phase interpolator 560c may include PMOS transistors 561c-564c and NMOS transistors 565c-568c. The PMOS transistors 561c and 563c and the NMOS transistors 565c and 567c are cascade-connected between the power supply voltage VDD and the ground voltage VSS, and the PMOS transistors 562c and 564c and the NMOS transistors 566c and 568c are cascade-connected between the power supply voltage VDD and the ground voltage VSS.

Gates of the PMOS transistor 561c and the NMOS transistor 567c receive the third sub delayed clock signal CLKSD, gates of the PMOS transistor 562c and the NMOS transistor 568c receive the second sub delayed clock signal CLKFS, gates of the PMOS transistor 563c and the NMOS transistor 566c receive the second control bit FDCC2 of the second sub control code set FDCC, and gates of the PMOS transistor 564c and the NMOS transistor 565c receive the first control bit FDCC1 of the second sub control code set FDCC. The PMOS transistor 564c and the NMOS transistor 566c may be connected to each other at a node N32.

A configuration of the phase interpolator 560d may be the same as a configuration of the phase interpolator 560c.

The node N31 and the node N32 are coupled to each other, and the inverter 569 averages voltage levels of the node N31 and the node N32 to output the second delayed and selected clock signal SCLKD2.

Figure 20:
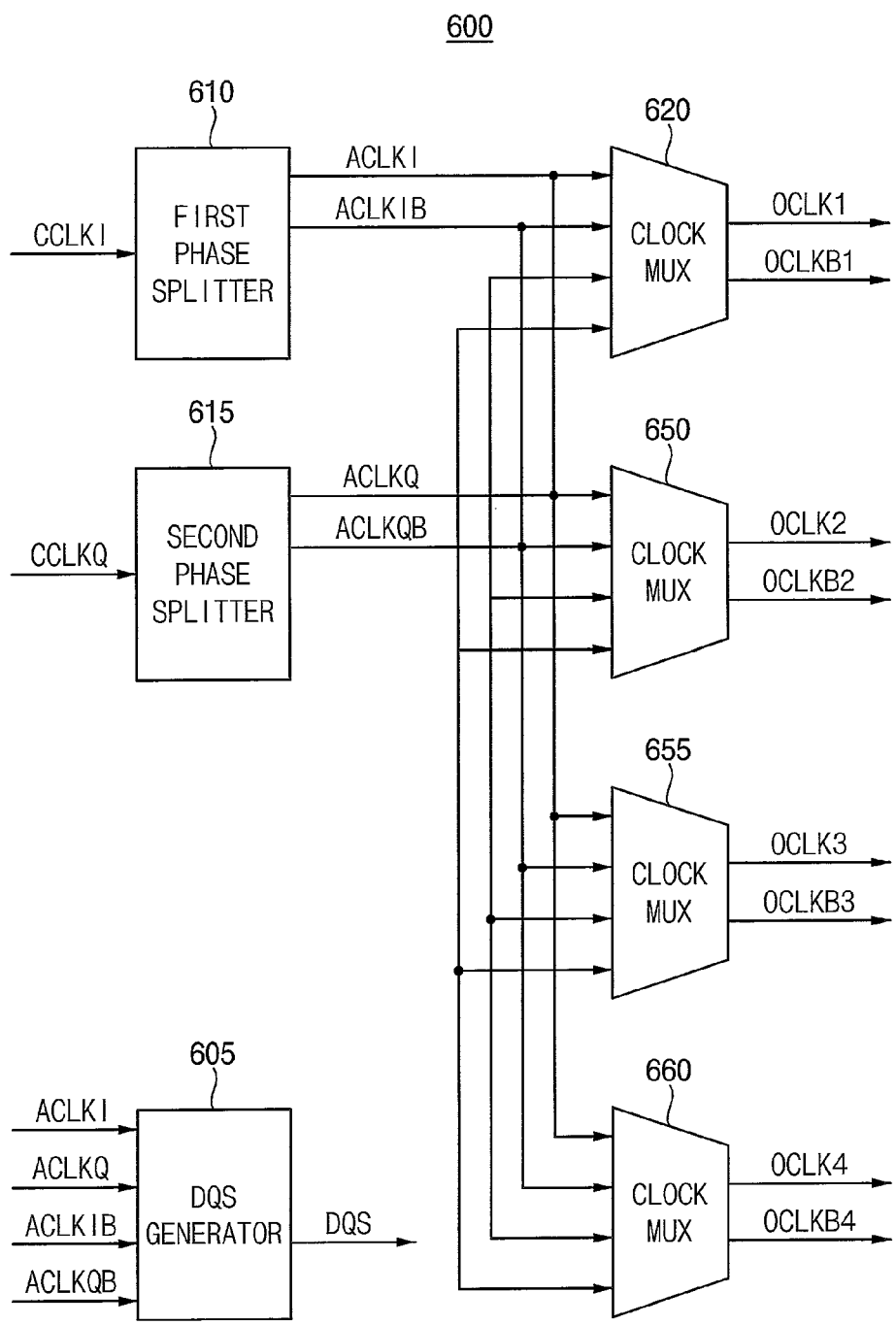
FIG. 20 is a block diagram illustrating an example of the clock generation circuit in the semiconductor memory device of FIG. 2 according to example embodiments.

FIG. 20 is a block diagram illustrating an example of the clock generation circuit in the semiconductor memory device of FIG. 2 according to example embodiments.

Referring to FIG. 20, the clock generation circuit 600 may include a first phase splitter 610, a second phase splitter 615, a strobe signal (DQS) generator 605 and first through fourth clock multiplexers 620, 650, 655 and 660.

The first phase splitter 610 may split a phase of the first corrected clock signal CCLKI to output a first adjusted clock signal ACLKI and a third adjusted clock signal ACLKIB having a phase difference of 180 degrees with respect to each other. The second phase splitter 615 may split a phase of the second corrected clock signal CCLKQ to output a second adjusted clock signal ACLKQ and a fourth adjusted clock signal ACLKQB having a phase difference of 180 degrees with respect to each other. The strobe signal generator 605, also described as a strobe signal generator circuit may generate the strobe signal DQS based on the first through fourth adjusted clock signals ACLKI, ACLKQ, ACLKIB and ACLKQB.

Each of the first through fourth clock multiplexers 620, 650, 655 and 660 may receive the first through fourth adjusted clock signals ACLKI, ACLKQ, ACLKIB and ACLKQB and may generate the first through fourth output clock signal pairs OCLK1 and OCLKB1, OCLK2 and OCLKB2, OCLK3 and OCLKB3 and OCLK4 and OCLKB4 by combining the first through fourth adjusted clock signals ACLKI, ACLKQ, ACLKIB and ACLKQB.

Figure 21:
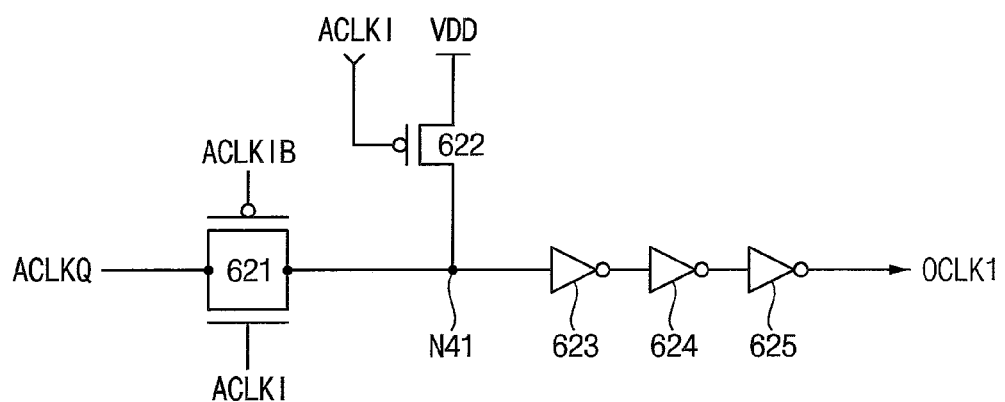
FIG. 21 is a circuit diagram illustrating an example of the first clock multiplexer in the clock generation circuit of FIG. 20 according to example embodiments.
Figure 21:
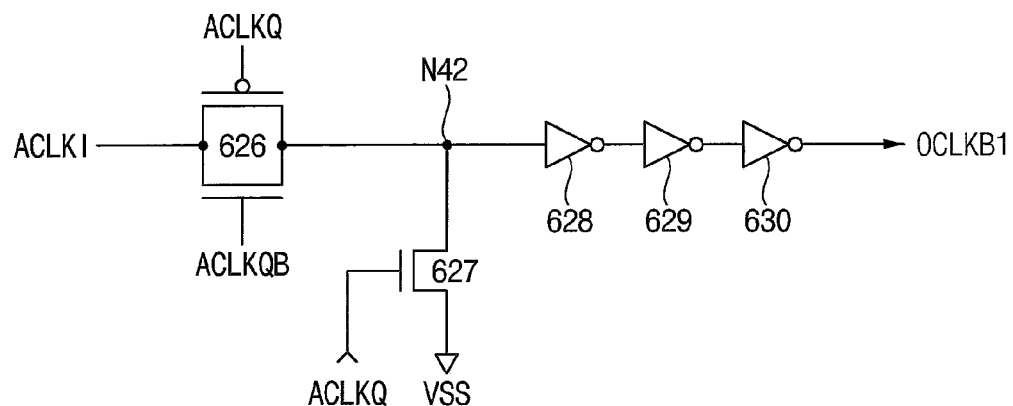

FIG. 21 is a circuit diagram illustrating an example of the first clock multiplexer in the clock generation circuit of FIG. 20 according to example embodiments.

Referring to FIG. 21, a first clock multiplexer 620a may include a transmission gate 621, a PMOS transistor 622, inverters 623, 624 and 625, a transmission gate 626, an NMOS transistor 627 and inverters 628, 629 and 630.

The transmission gate 621 may transfer the second adjusted clock signal ACLKQ to a node N41 based on the first adjusted clock signal ACLKI and the third adjusted clock signal ACLKIB. The PMOS transistor 622 is connected between the power supply voltage VDD and the node N41 and has a gate to receive the first adjusted clock signal ACLKI. The PMOS transistor 622 precharges the node N41 to a level of the power supply voltage VDD in response to the first adjusted clock signal ACLKI. The inverters 623, 624 and 625 invert a level of the node N41 three times to provide a first output clock signal OCLK1.

The transmission gate 626 may transfer the first adjusted clock signal ACLKI to a node N42 based on the second adjusted clock signal ACLKQ and the fourth adjusted clock signal ACLKQB. The NMOS transistor 627 is connected between the node N42 and the ground voltage VSS and has a gate to receive the second adjusted clock signal ACLK. The NMOS transistor 627 discharges the node N42 to a level of the ground voltage VSS in response to the second adjusted clock signal ACLKQ. The inverters 628, 629 and 670 invert a level of the node N42 three times to provide a first inverted output clock signal OCLKB1.

Each of the second through fourth clock multiplexers 650, 655 and 660 in FIG. 20 may have a same configuration as the clock multiplexer 620a of FIG. 21.

Figure 22:
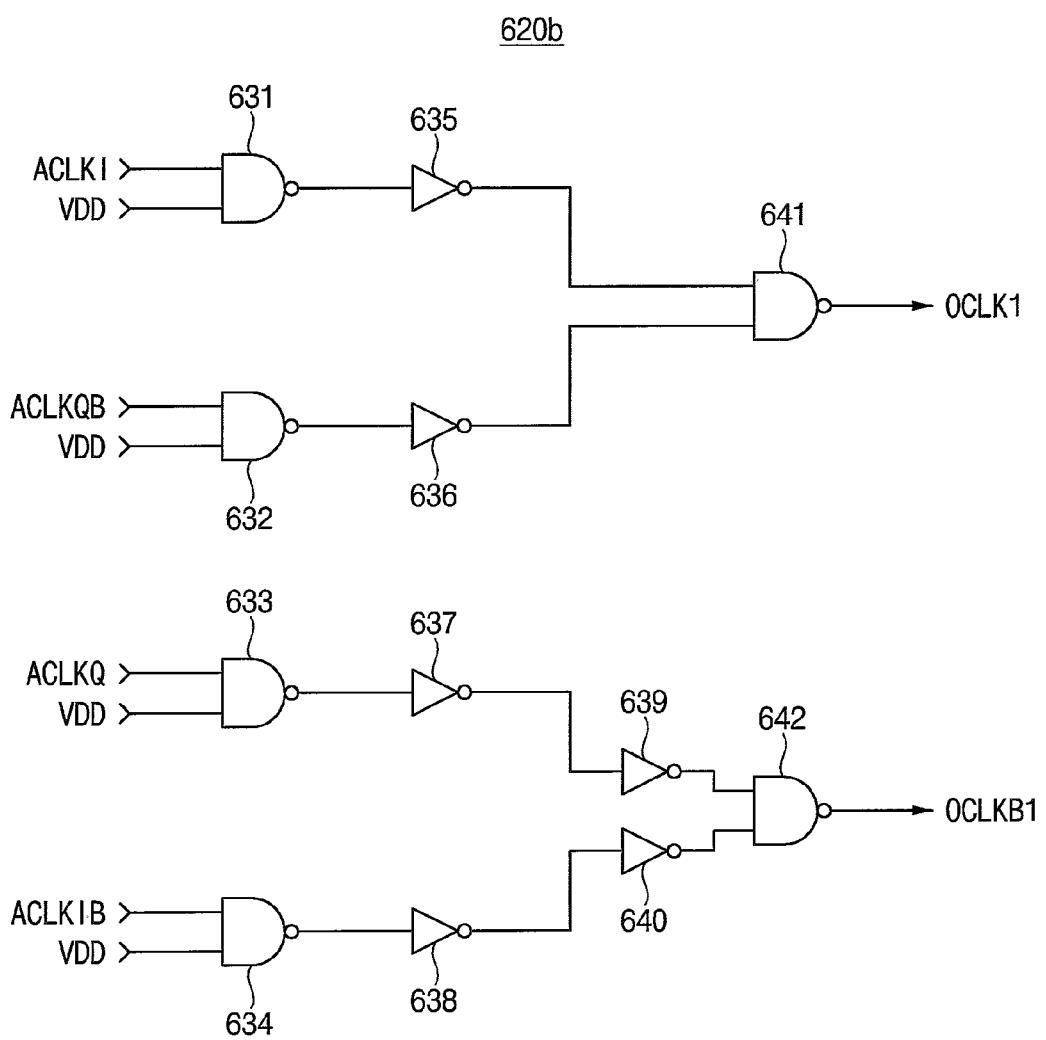
FIG. 22 is a circuit diagram illustrating an example of the first clock multiplexer in the clock generation circuit of FIG. 20 according to example embodiments.

FIG. 22 is a circuit diagram illustrating an example of the first clock multiplexer in the clock generation circuit of FIG. 20 according to example embodiments.

Referring to FIG. 22, a first clock multiplexer 620*b* may include NAND gates 631, 632, 633 and 634, inverters 635, 636, 637, 638, 639 and 640 and NAND gates 641 and 642.

The NAND gate 631 performs a NAND operation on the first adjusted clock signal ACLKI and the power supply voltage, the NAND gate 632 performs a NAND operation on the fourth adjusted clock signal ACLKQB and the power supply voltage VDD, the NAND gate 633 performs a NAND operation on the second adjusted clock signal ACLKQ and the power supply voltage VDD and the NAND gate 634 performs a NAND operation on the third adjusted clock signal ACLKIB and the power supply voltage VDD.

The inverter 635 inverts an output of the NAND gate 631, the inverter 636 inverts an output of the NAND gate 632, and the NAND gate 641 performs a NAND operation on outputs of the inverters 635 and 639 to provide the first output clock signal OCLK1. The inverters 637 and 639 sequentially invert an output of the NAND gate 633, the inverters 638 and 640 sequentially invert an output of the NAND gate 634 and the NAND gate 642 performs a NAND operation on outputs of the inverters 639 and 640 to provide the first inverted output clock signal OCLKB1.

Each of the second through fourth clock multiplexers 650, 655 and 660 in FIG. 20 may have a same configuration as the clock multiplexer 620*b* of FIG. 22.

Figure 23:
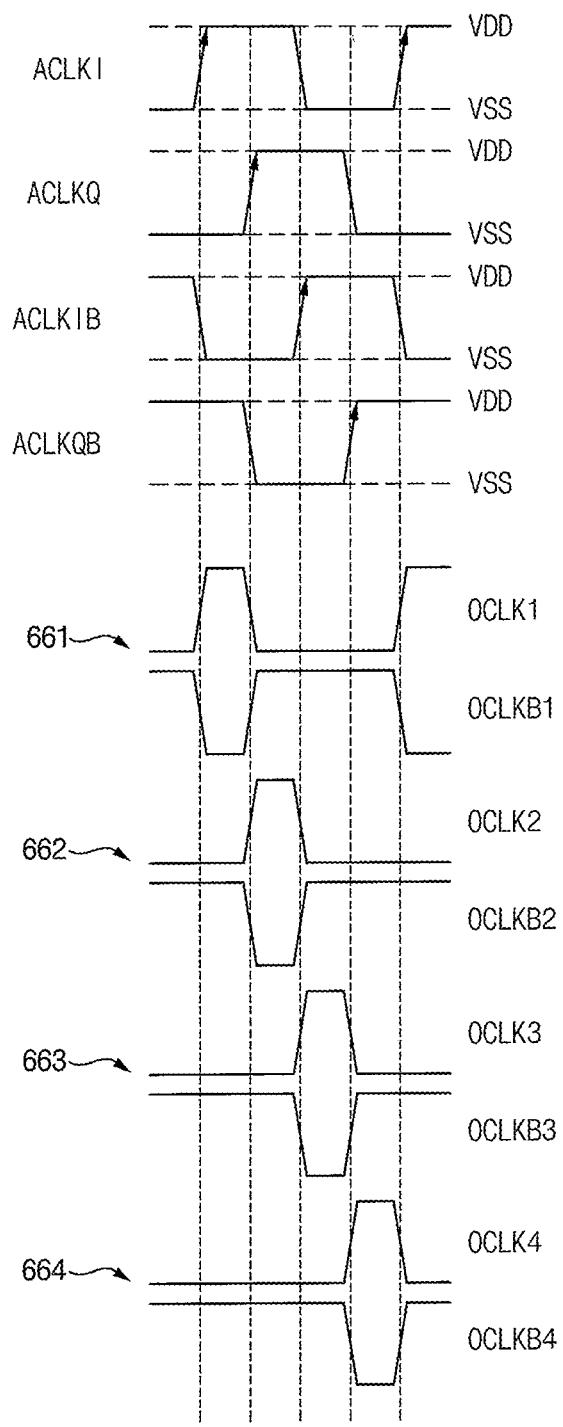
FIG. 23 illustrates first through fourth output clock signal pairs when each of the first through fourth clock multiplexers in FIG. 20 employs the first clock multiplexer of FIG. 21.

FIG. 23 illustrates first through fourth output clock signal pairs when each of the first through fourth clock multiplexers in FIG. 20 employs the first clock multiplexer of FIG. 21.

Referring to FIGS. 20, 21 and 23, the first clock multiplexer 620*a* may generate the first output clock signal pair OCLK1 and OCLKB1 which have a rising edge synchronized with a rising edge of the first adjusted clock signal ACLKI and a falling edge synchronized with a rising edge of the second adjusted clock signal ACLKQ by combining the first through fourth adjusted clock signals ACLKI, ACLKQ, ACLKIB and ACLKQB as a reference numeral 661 indicates.

The second clock multiplexer 650 may generate the second output clock signal pair OCLK2 and OCLKB2 which have a rising edge synchronized with a rising edge of the second adjusted clock signal ACLKQ and a falling edge synchronized with a rising edge of the third adjusted clock signal ACLKIB by combining the first through fourth adjusted clock signals ACLKI, ACLKQ, ACLKIB and ACLKQB as a reference numeral 662 indicates.

The third clock multiplexer 655 may generate the third output clock signal pair OCLK3 and OCLKB3 which have a rising edge synchronized with a rising edge of the third adjusted clock signal ACLKIB and a falling edge synchronized with a rising edge of the fourth adjusted clock signal ACLKQB by combining the first through fourth adjusted clock signals ACLKI, ACLKQ, ACLKIB and ACLKQB as a reference numeral 663 indicates.

The fourth clock multiplexer 660 may generate the fourth output clock signal pair OCLK4 and OCLKB4 which have a rising edge synchronized with a rising edge of the fourth adjusted clock signal ACLKQB and a falling edge synchronized with a rising edge of the first adjusted clock signal ACLKI by combining the first through fourth adjusted clock signals ACLKI, ACLKQ, ACLKIB and ACLKQB as a reference numeral 664 indicates.

Figure 24:
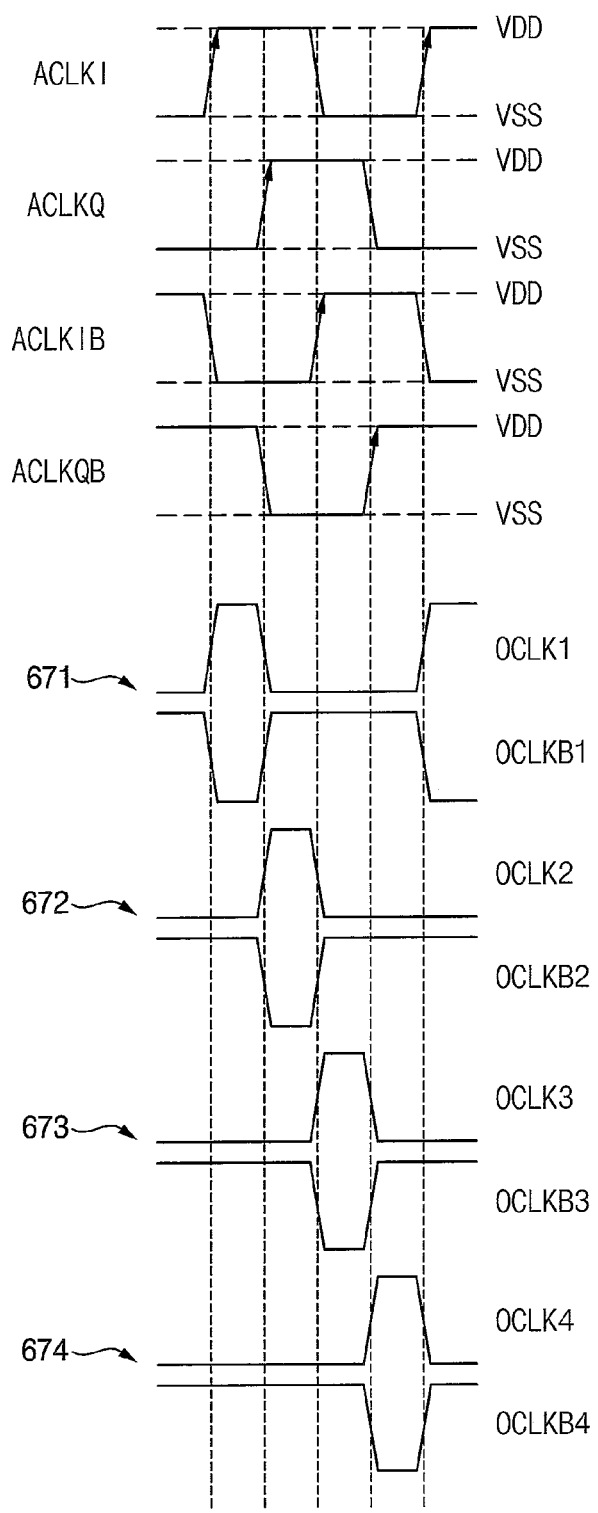
FIG. 24 illustrates first through fourth output clock signal pairs when each of the first through fourth clock multiplexers in FIG. 20 employs the first clock multiplexer of FIG. 22.

FIG. 24 illustrates first through fourth output clock signal pairs when each of the first through fourth clock multiplexers in FIG. 20 employs the first clock multiplexer of FIG. 22.

Referring to FIGS. 20, 22 and 24, the first clock multiplexer 620*b* may generate the first output clock signal OCLK1 which has a rising edge synchronized with a rising edge of the first adjusted clock signal ACLKI and a falling edge synchronized with a rising edge of the fourth adjusted clock signal ACLKQB and may generate the first inverted output clock signal OCLKB1 which has a falling edge synchronized with a falling edge of the third adjusted clock signal ACLKIB and a rising edge synchronized with a rising edge of the second adjusted clock signal ACLKQ by combining the first through fourth adjusted clock signals ACLKI, ACLKQ, ACLKIB and ACLKQB as a reference numeral 671 indicates.

The second clock multiplexer 650 may generate the second output clock signal OCLK2 which has a rising edge synchronized with a rising edge of the second adjusted clock signal ACLKQ and a falling edge synchronized with a falling edge of the first adjusted clock signal ACLKI and may generate the second inverted output clock signal OCLKB2 which has a falling edge synchronized with a falling edge of the fourth adjusted clock signal ACLKQB and a rising edge synchronized with a rising edge of the third adjusted clock signal ACLKIB by combining the first through fourth adjusted clock signals ACLKI, ACLKQ, ACLKIB and ACLKQB as a reference numeral 672 indicates.

The third clock multiplexer 655 may generate the third output clock signal OCLK3 which has a rising edge synchronized with a rising edge of the third adjusted clock signal ACLKIB and a falling edge synchronized with a falling edge of the second adjusted clock signal ACLKQ and may generate the third inverted output clock signal OCLKB3 which has a falling edge synchronized with a falling edge of the first adjusted clock signal ACLKI and a rising edge synchronized with a rising edge of the fourth adjusted clock signal ACLKQB by combining the first through fourth adjusted clock signals ACLKI, ACLKQ, ACLKIB and ACLKQB as a reference numeral 673 indicates.

The fourth clock multiplexer 660 may generate the fourth output clock signal OCLK4 which has a rising edge synchronized with a rising edge of the fourth adjusted clock signal ACLKQB and a falling edge synchronized with a falling edge of the third adjusted clock signal ACLKIB and may generate the fourth inverted output clock signal OCLKB4 which has a falling edge synchronized with a falling edge of the second adjusted clock signal ACLKQ and a rising edge synchronized with a rising edge of the first adjusted clock signal ACLKI by combining the first through fourth adjusted clock signals ACLKI, ACLKQ, ACLKIB and ACLKQB as a reference numeral 674 indicates.

Therefore, the first through fourth clock multiplexers 620, 650, 655 and 660 may output the first through fourth output clock signal pairs OCLK1 and OCLKB1, OCLK2 and OCLKB2, OCLK3 and OCLKB3 and OCLK4 and OCLKB4 having rising edges and falling edges which are synchronized with rising edges and falling edges of the first through fourth adjusted clock signals ACLKI, ACLKQ, ACLKIB and ACLKQB.

Figure 25:
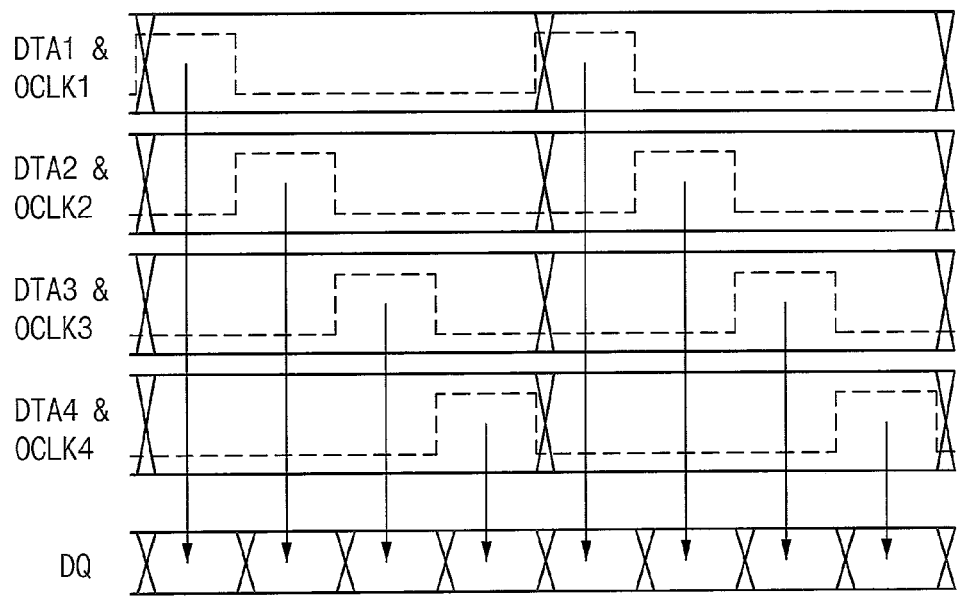
FIG. 25 illustrates data signal output from the data I/O buffer based on the output clock signals in FIG. 3.

FIG. 25 illustrates data signal output from the data I/O buffer based on the output clock signals in FIG. 23.

Referring to FIG. 25, the data output circuit 340 in FIG. 5 may output the data signal DQ by sampling a first bit DTA1 of the data DTA based on the first output clock signal OCLK1, by sampling a second bit DTA2 of the data DTA based on the second output clock signal OCLK2, by sampling a third bit DTA3 of the data DTA based on the third output clock signal OCLK3 and by sampling a fourth bit DTA4 of the data DTA based on the fourth output clock signal OCLK4. Therefore, a toggling frequency of the data signal DQ may be greater than a toggling frequency of each of the first through fourth output clock signals OCLK1, OCLK2, OCLK3 and OCLK4.

Figure 26:
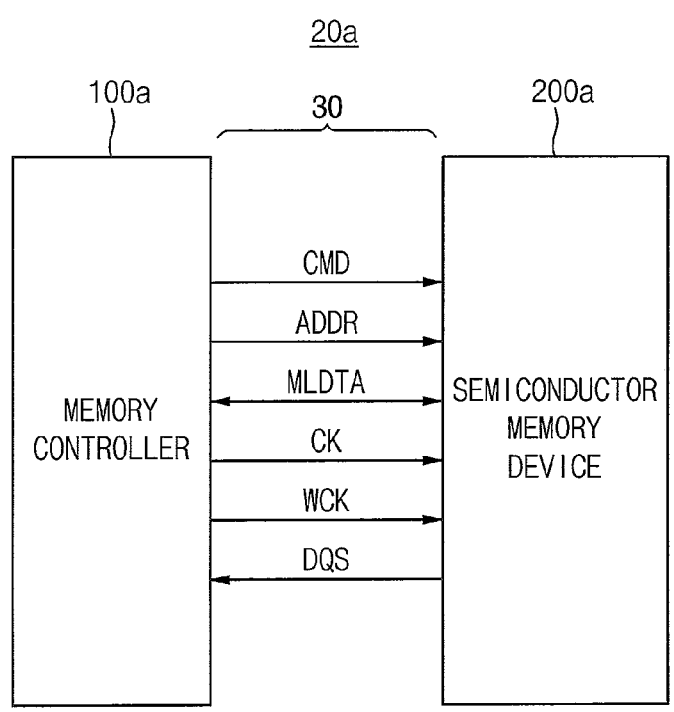
FIG. 26 is a block diagram illustrating a memory system according to example embodiments.

FIG. 26 is a block diagram illustrating a memory system according to example embodiments.

Referring to FIG. 26, a memory system 20a may include a memory controller 100a and a semiconductor memory device 200a. The memory system 20a may further include a plurality of signal lines 30 that electrically connect the memory controller 100a with the semiconductor memory device 200a.

The memory system 20a differs from the memory system 20 of FIG. 1 in that the memory controller 100a and the semiconductor memory device 200a exchange multi-level data signal MLDTA instead of the data signal DQ.

A multi-level signaling scheme may be used as a means of compressing the bandwidth required to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed. The alphabet of symbols may be constructed from a number of different voltage levels. For example, in a four-level scheme, groups of two data bits may be mapped to one of four symbols. Only one symbol need be transmitted for each pair of data bits, so the symbol rate may be a half of the bit rate.

In other words, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signal may represent a plurality of bits of data. The number of possible pulse amplitudes in a digital PAM scheme may be some power of two. For example, there may be 22 possible discrete pulse amplitudes in a 4-level PAM (e.g., in PAM4), there may be 23 possible discrete pulse amplitudes in an 8-level PAM (e.g., in PAM8), and there may be 24 possible discrete pulse amplitudes in a 16-level PAM (e.g., in PAM16). However, example embodiments are not limited thereto, and example embodiments may be applied or employed to a K-level PAM (e.g., PAM(K)) having K possible pulse amplitudes, where K is a natural number greater than or equal to three.

Figure 27:
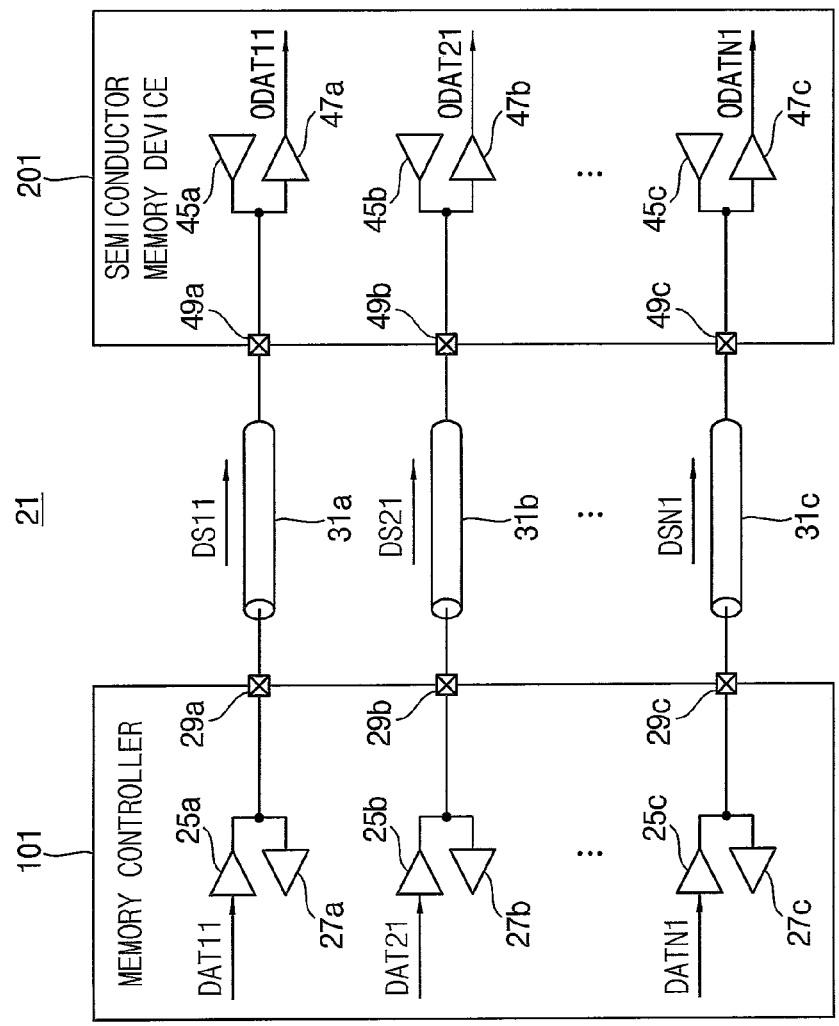
FIGS. 27 and 28 are block diagrams illustrating an example of a memory system of FIG. 26.
Figure 28:
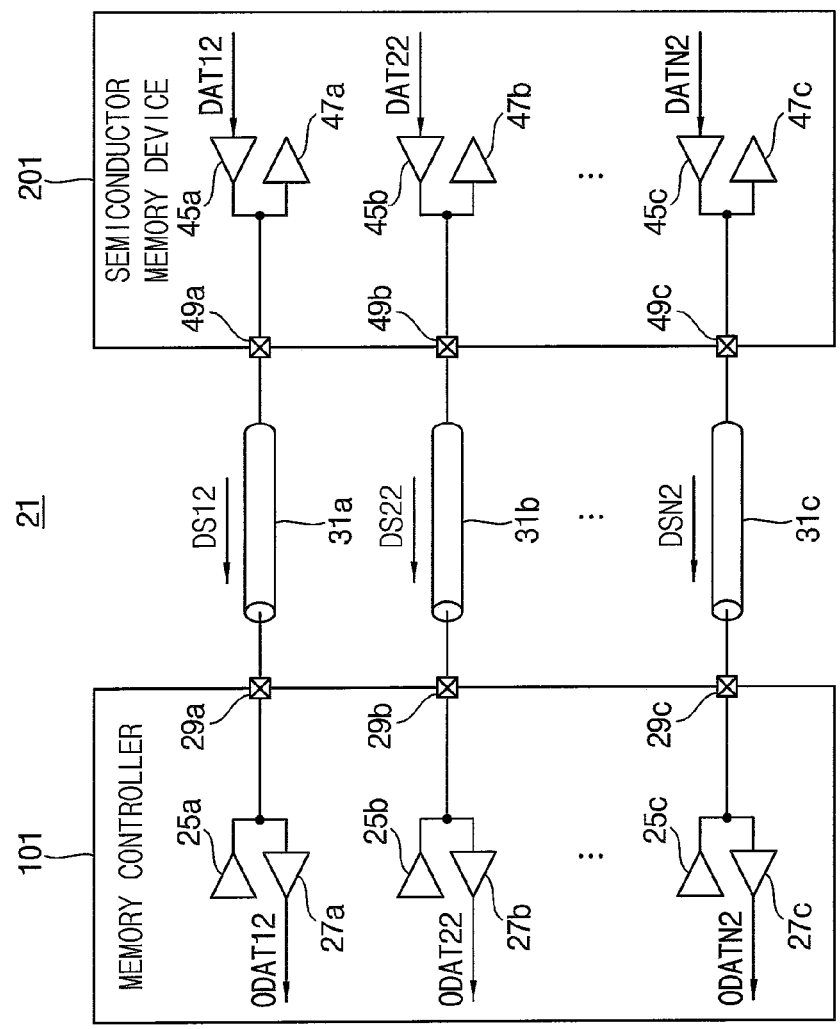

FIGS. 27 and 28 are block diagrams illustrating an example of a memory system of FIG. 26.

Referring to FIGS. 27 and 28, a memory system 21 may include a memory controller 101, a semiconductor memory device 201 and a plurality of channels 31a, 31b and 31c.

The memory controller 101 may include a plurality of transmitters 25a, 25b and 25c, a plurality of receivers 27a, 27b and 27c, and a plurality of data I/O pads 29a, 29b and 29c. The semiconductor memory device 201 may include a plurality of transmitters 45a, 45b and 45c, a plurality of receivers 47a, 47b and 47c, and a plurality of data I/O pads 49a, 49b and 49c.

Each of the plurality of transmitters 25a, 25b, 25c, 45a, 45b and 45c may generate a multi-level signal, may perform the method of generating multi-level signal. Each of the plurality of receivers 27a, 27b, 27c, 47a, 47b and 47c may receive the multi-level signal. The plurality of transmitters 25a, 25b, 25c, 45a, 45b and 45c and the plurality of receivers 27a, 27b, 27c, 47a, 47b and 47c may transmit and receive multi-level signals through the plurality of channels 31a, 31b and 31c.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c.

The plurality of channels 31a, 31b and 31c may connect the memory controller 201 with the semiconductor memory device 201.

Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c. The multi-level signal may be transmitted through each of the plurality of channels 31a, 31b and 31c.

FIG. 27 illustrates an operation of transferring data from the memory controller 101 to the semiconductor memory device 201. For example, the transmitter 25a may generate an output data signal DS11, which is the multi-level signal, based on input data DAT11, the output data signal DS11 may be transmitted from the memory controller 21 to the memory device 41 through the channel 31a, and the receiver 47a may receive the output data signal DS11 to obtain data ODAT11 corresponding to the input data DAT11.

Similarly, the transmitter 25b may generate an output data signal DS21, which is the multi-level signal, based on input data DAT21, the output data signal DS21 may be transmitted to the memory device 41 through the channel 31b, and the receiver 47b may receive the output data signal DS21 to obtain data ODAT21 corresponding to the input data DAT21. The transmitter 25c may generate an output data signal DSN1, which is the multi-level signal, based on input data DATN1, the output data signal DSN1 may be transmitted to the semiconductor memory device 201 through the channel 31c, and the receiver 47c may receive the output data signal DSN1 to obtain data ODATN1 corresponding to the input data DATN1. For example, the input data DAT11, DAT21 and DATN1 may be write data to be written into the semiconductor memory device 201.

FIG. 28 illustrates an operation of transferring data from the semiconductor memory device 201 to the memory controller 101. For example, the transmitter 45a may generate an output data signal DS12, which is the multi-level signal, based on input data DAT12, the output data signal DS12 may be transmitted from the memory device 41 to the memory controller 21 through the channel 31a, and the receiver 27a may receive the output data signal DS12 to obtain data ODAT12 corresponding to the input data DAT12.

Similarly, the transmitter 45b may generate an output data signal DS22, which is the multi-level signal, based on input data DAT22, the output data signal DS22 may be transmitted to the memory controller 21 through the channel 31b, and the receiver 27b may receive the output data signal DS22 to obtain data ODAT22 corresponding to the input data DAT22. The transmitter 45c may generate an output data signal DSN2, which is the multi-level signal, based on input data DATN2, the output data signal DSN2 may be transmitted to the memory controller 101 through the channel 31c, and the receiver 27c may receive the output data signal DSN2 to obtain data ODATN2 corresponding to the input data DATN2. For example, the input data DAT12, DAT22 and DATN2 may be read data retrieved from the semiconductor memory device 201.

Figure 29:
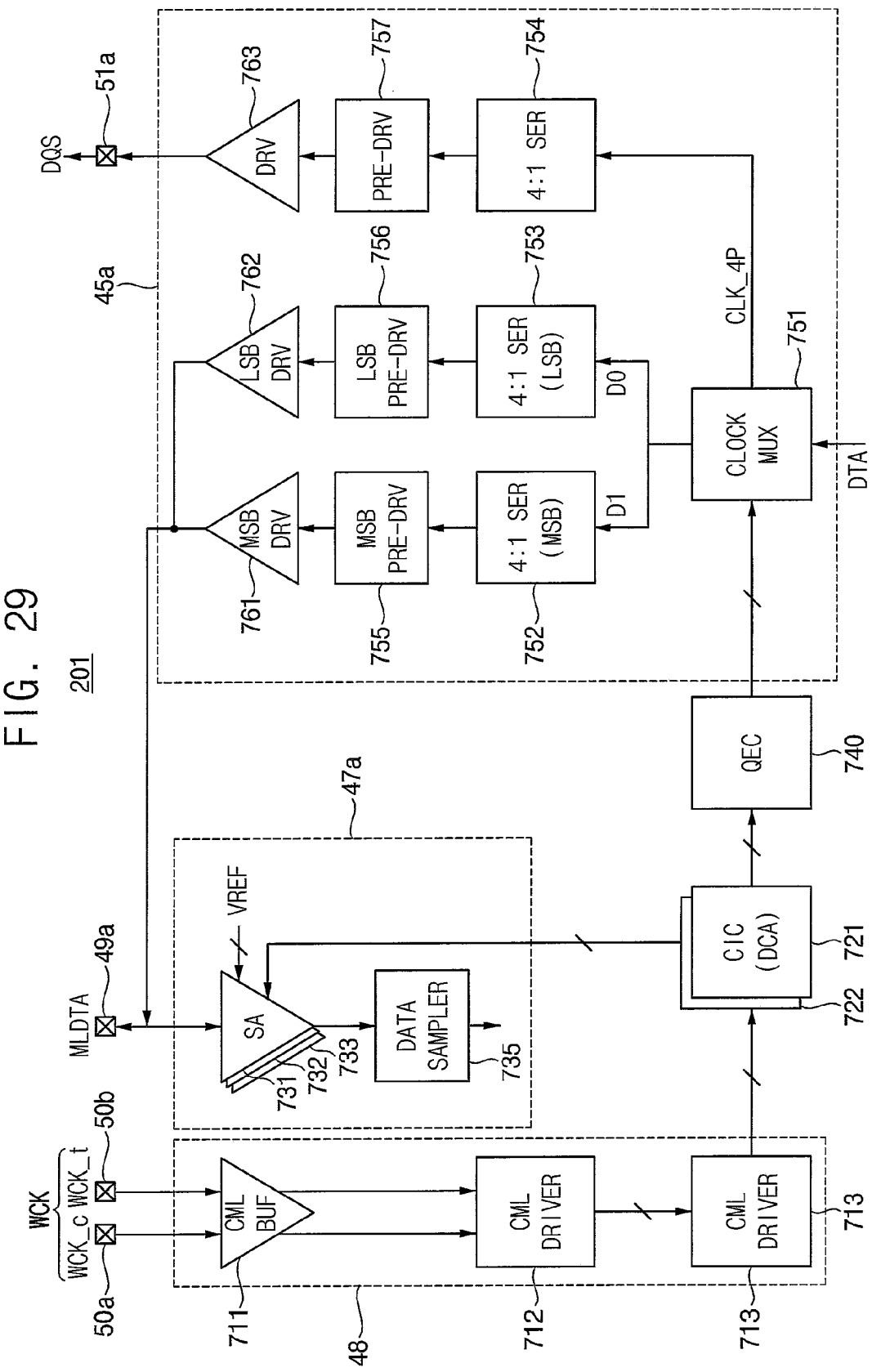
FIG. 29 is a block diagram illustrating an example of the semiconductor memory device in the memory system of FIG. 26.

FIG. 29 is a block diagram illustrating an example of the semiconductor memory device in the memory system of FIG. 26.

FIG. 29 illustrates a data clock buffer 48, the receiver 47a, the transmitter 45a, C2C converters 721 and 722 and a quadrature error correction circuit 740 from among components of the semiconductor memory device 201.

The data clock buffer 48 may include a CML buffer 711, a CML driver 712 and a CML driver 713.

The CML buffer 711 may receive the data clock signal WCK including differential clock signal pair WCK_t and WCK_c through pads 50a and 50b and may provide the data clock signal WCK to the CML driver 712. The CML driver 712 may drive the data clock signal WCK to a CML level and the CML driver 713 may drive an output of the CML driver 712 to a CML level to provide an output to the C2C converters 721 and 722. Each of the C2C converters 721 and 722 including the C2C converter 239 in FIG. 4, may convert the output of the CML driver 713 to CMOS level and C2C converters 721 and 722 may output a first clock signal and a second clock signal having a phase difference of 90 degrees to the quadrature error correction circuit 740.

The quadrature error correction circuit 740 may employ the quadrature error correction circuit 400 of FIG. 7, may generate first through fourth adjusted clock signals by concurrently adjusting duties of the first clock signal and the second clock signal and a skew between the first clock signal and the second clock signal and may provide the first through fourth adjusted clock signals to the transmitter 45a.

The receiver 47a may include sense amplifies 731, 732 and 733 and a data sampler 735. Each of the sense amplifies 731, 732 and 733 may output a comparison signal by comparing the multi-level signal MLDTA with a corresponding reference voltage VREF, and the data sampler 735 may determine a logic level of the multi-level signal MLDTA based on comparison signals from the sense amplifies 731, 732 and 733. The C2C converters 721 and 722 may provide clock signals to the sense amplifies 731, 732 and 733.

The transmitter 45a may include a clock multiplexer 751, serializers 752, 753 and 754, pre-drivers 755, 756 and 757 and drivers 761, 762 and 763.

The clock multiplexer 751 may provide a most significant bit (MSB) D1 of the data DAT to the serializer 752, may provide a least significant bit (LSB) DO of the data DAT to the serializer 753 and may provide a four-phase clock signal CLK_4P to the serializer 754 based on the first through fourth adjusted clock signal from the quadrature error correction circuit 740 and the data DTA.

The pre-driver 755 may drive an output of the serializer 752 and the driver 761 may drive an output of the pre-driver 755. The pre-driver 756 may drive an output of the serializer 753 and the driver 762 may drive an output of the pre-driver 756. The pre-driver 757 may drive an output of the serializer 754 and the driver 763 may drive an output of the pre-driver 757 to transmit the strobe signal DQS to the memory controller 101.

Figure 30:
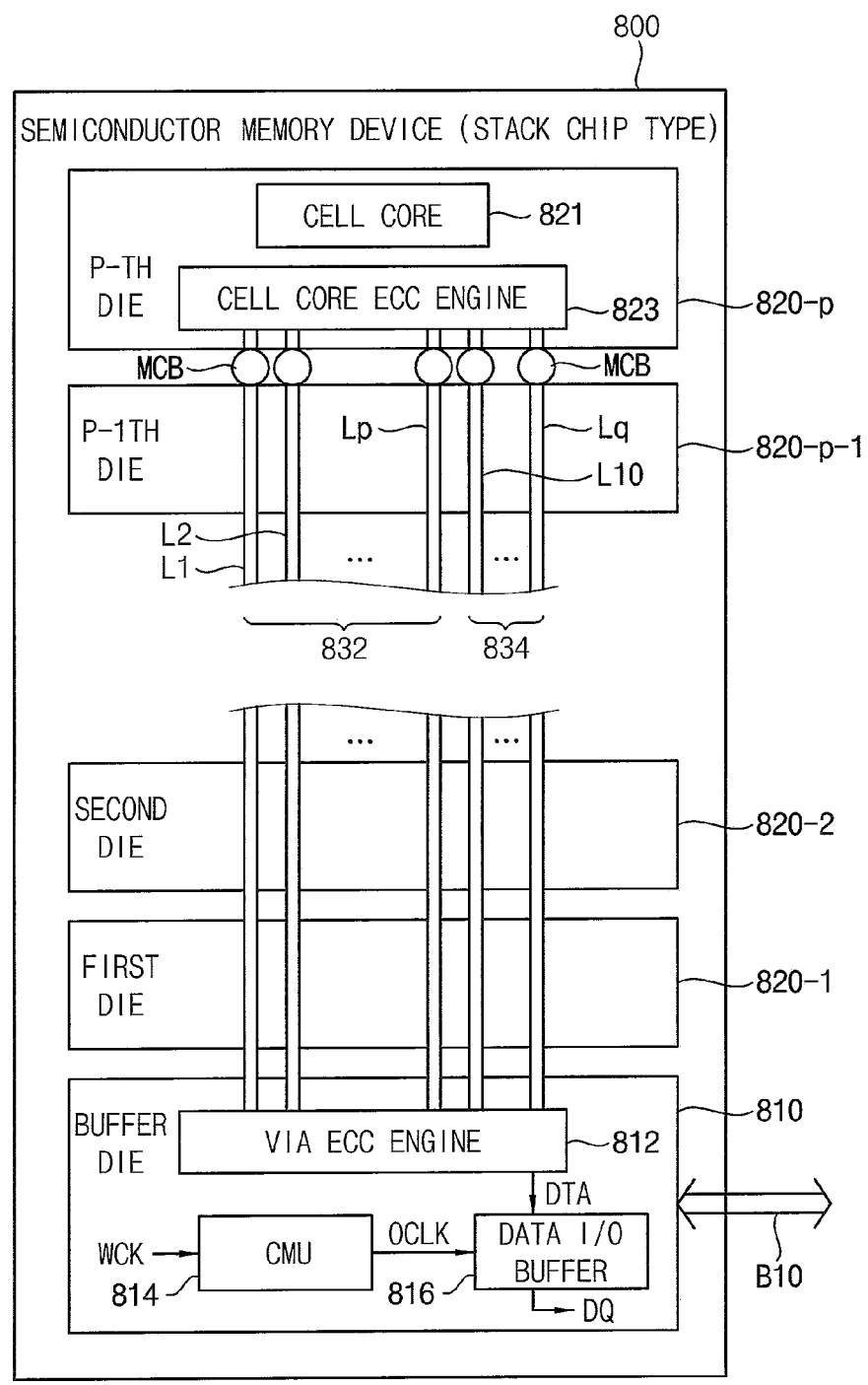
FIG. 30 is a block diagram illustrating a semiconductor memory device according to example embodiments.

FIG. 30 is a block diagram illustrating a semiconductor memory device according to example embodiments.

Referring to FIG. 30, a semiconductor memory device 800 may include at least one buffer die 810 and a plurality of memory dies 820-1 to 820-p (p is a natural number equal to or greater than three) providing a soft error analyzing and correcting function in a stacked chip structure.

The plurality of memory dies 820-1 to 820-p are stacked on the buffer die 810 and convey data through a plurality of through silicon via (TSV) lines, more generally described as through substrate via lines.

At least one of the memory dies 820-1 to 820-p may include a memory core to store data and a cell core ECC engine 823 which generates transmission parity bits (i.e., transmission parity data) based on transmission data to be sent to the at least one buffer die 810. The cell core 821 may include a plurality of memory cells having DRAM cell structure.

The buffer die 810 may include a via ECC engine 812 which corrects a transmission error using the transmission parity bits when a transmission error is detected from the transmission data received through the TSV lines and generates error-corrected data.

The buffer die 810 may further include a clock management unit (CMU) 814 and a data I/O buffer 816. The CMU 814 may employ the quadrature error correction circuit 400 of FIG. 7 and the clock generation circuit 600 of FIG. 20, may generate corrected clock signals whose duty and skew are concurrently adjusted based on the data clock signal WCK and may generate the output clock signal OCLK based on the corrected clock signals. The data I/O buffer 816 may generate the data signal DQ by sampling the data DTA from the via ECC engine 812 and may output the data signal DQ to an outside.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-p before the transmission data is sent.

A data TSV line group 832 which is formed at one memory die 820-p may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-p.

The semiconductor memory device 800 may have a three-dimensional (3D) chip structure or a 2.5D chip structure to communicate with the host through a data bus B10. The buffer die 810 may be connected with the memory controller through the data bus B10. The semiconductor memory device 800 may be part of a semiconductor memory package.

According to example embodiments, as illustrated in FIG. 30, the cell core ECC engine 823 may be included in the memory die, the via ECC engine 812 may be included in the buffer die. Accordingly, it may be possible to detect and correct soft data fail. The soft data fail may include a transmission error which is generated due to noise when data is transmitted through TSV lines.

Figure 31:
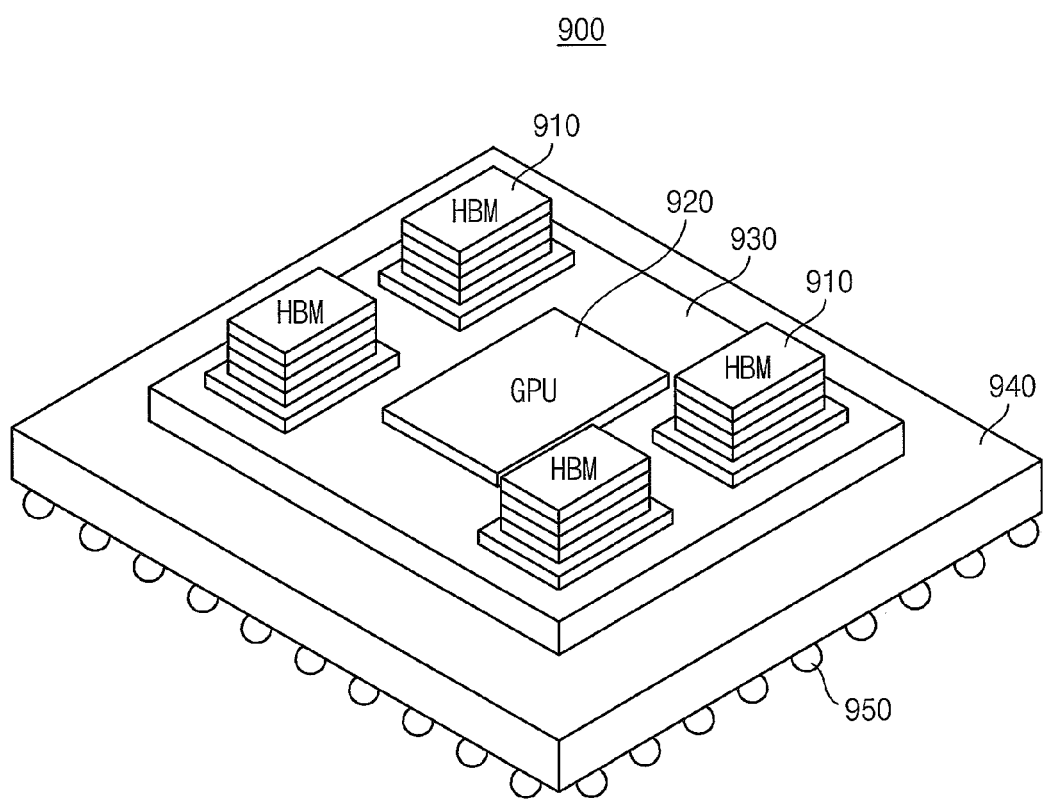
FIG. 31 is a configuration diagram illustrating a semiconductor package including the stacked memory device according to example embodiments.

FIG. 31 is a configuration diagram illustrating a semiconductor package including the stacked memory device according to example embodiments.

Referring to FIG. 31, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950.

The GPU 920 may correspond to a semiconductor device which may perform a memory control function, and for example, the GPU 920 may be implemented as an application processor (AP).

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and the buffer die may include the above-mentioned quadrature error correction circuit and a clock generation circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of the present inventive concept may be applied to systems using semiconductor memory devices that employ volatile memory cells and data clock signals. For example, aspects of the present inventive concept may be applied to systems such as a smart phone, a navigation system, a notebook computer, a desktop computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present invention as defined in the claims.

What is claimed is:

1. A quadrature error correction circuit in a semiconductor memory device, the quadrature error correction circuit comprising:
    a duty cycle adjusting circuit configured to receive a first clock signal and a second clock signal which are generated based on a data clock signal, and configured to generate a first corrected clock signal and a second corrected clock signal which have a phase difference of 90 degrees with respect to each other and wherein a skew and a duty cycle error between the first corrected clock signal and the second corrected clock signal are concurrently adjusted based on a plurality of control code sets;
    a first phase splitter configured to split a phase of the first corrected clock signal to output a first adjusted clock signal and a third adjusted clock signal having a phase difference of 180 degrees with respect to each other;
    a second phase splitter configured to split a phase of the second corrected clock signal to output a second adjusted clock signal and a fourth adjusted clock signal having a phase difference of 180 degrees with respect to each other;
    a phase interpolator configured to generate a second delayed and selected clock signal by delaying a second selected clock signal having a phase difference of 90 degrees with respect to a first selected clock signal, the first selected clock signal and the second selected clock signal being selected from among the first through fourth adjusted clock signals;
    a phase detector configured to detect a phase difference between the first selected clock signal and the second delayed and selected clock signal to generate an up/down signal; and
    a delay control circuit configured to generate the plurality of control code sets based on the up/down signal.

2. The quadrature error correction circuit of claim 1,
    wherein the plurality of control code sets includes a first control code set, a second control code set, a third control code set and a fourth control code set, and
    wherein the duty cycle adjusting circuit is configured to correct the skew and the duty cycle error between the first corrected clock signal and the second corrected clock signal by adjusting a delay of a rising edge of the second clock signal with respect to a rising edge of the first clock signal, adjusting a delay of a falling edge of the first clock signal with respect to the adjusted rising edge of the second clock signal, and adjusting a delay of a falling edge of the second clock signal with respect to the adjusted falling edge of the first clock signal, based on the first control code set, the second control code set, the third control code set, and the fourth control code set, the first clock signal and the second clock signal having a phase difference of 90 degrees with respect to each other.

3. The quadrature error correction circuit of claim 2, wherein the phase interpolator is configured to delay the second selected clock signal with respect to the first selected clock signal based on the fourth control code set.

4. The quadrature error correction circuit of claim 1,
    wherein the plurality of control code sets includes a first control code set, a second control code set, a third control code set and a fourth control code set, and
    wherein the duty cycle adjusting circuit includes:
    a first duty cycle adjuster circuit configured to generate the second corrected clock signal by adjusting the delay of a rising edge of the second clock signal based on the first control code set and by adjusting the delay of a falling edge of the second clock signal based on the third control code set; and
    a second duty cycle adjuster circuit configured to generate the first corrected clock signal by adjusting the delay of the rising edge of the first clock signal based on the fourth control code set and by adjusting the delay of the falling edge of the first clock signal based on the second control code set.

5. The quadrature error correction circuit of claim 4, wherein the first duty cycle adjuster circuit includes:
    a first stage configured to provide an intermediate clock signal by adjusting the delay of the rising edge of the second clock signal based on the first control code set; and
    a second stage configured to provide the second corrected clock signal by adjusting the delay of the falling edge of the intermediate clock signal based on the third control code set.

6. The quadrature error correction circuit of claim 5,
    wherein the first stage includes a plurality of first unit cells which are cascade-connected, and
    wherein:

each of the first unit cells includes a first p-channel metal-oxide semiconductor (PMOS) transistor, a second PMOS transistor, a first n-channel metal-oxide semiconductor (NMOS) transistor and a second NMOS transistor which are connected in series between a power supply voltage and a ground voltage, each gate of the second PMOS transistors and each gate of the first NMOS transistors receive the second clock signal, each gate of the second NMOS transistors receives a respective one of bits of the first control code set, and each gate of a first set of the first PMOS transistors is connected to the power supply voltage and each gate of a second set of the first PMOS transistors is connected to the ground voltage.

7. The quadrature error correction circuit of claim 5, wherein the second stage includes a plurality of second unit cells which are cascade-connected, and wherein:

each of the second unit cells includes a first p-channel metal-oxide semiconductor (PMOS) transistor, a second PMOS transistor, a first n-channel metal-oxide semiconductor (NMOS) transistor and a second NMOS transistor which are connected in series between a power supply voltage and a ground voltage, each gate of the second PMOS transistors and each gate of the first NMOS transistors receives the intermediate clock signal, each gate of the second NMOS transistors receives a respective one of bits of the second control code set, and each gate of a first set of the first PMOS transistors is connected to the power supply voltage and each gate of a second set of the first PMOS transistors is connected to the ground voltage.

8. The quadrature error correction circuit of claim 4, wherein the second duty cycle adjuster circuit includes:

a first stage configured to provide an intermediate clock signal by adjusting the delay of the rising edge of the first clock signal based on the fourth control code set; and a second stage configured to provide the first corrected clock signal by adjusting the delay of the falling edge of the intermediate clock signal based on the second control code set.

9. The quadrature error correction circuit of claim 4, wherein the delay control circuit includes:

a first delay controller configured to adjust code values of the first control code set based on the up/down signal to provide the first control code set to the first duty cycle adjuster circuit;

a second delay controller configured to adjust code values of the second control code set based on the up/down signal to provide the second duty cycle adjuster circuit with the second control code set and the fourth control code set whose code values are fixed;

a third delay controller configured to adjust code values of the third control code set based on the up/down signal to provide the third control code set to the first duty cycle adjuster circuit; and a fourth delay controller configured to adjust code values of the fourth control code set based on the up/down signal to provide the fourth control code set to the phase interpolator.

10. The quadrature error correction circuit of claim 1, further comprising:

a first multiplexer configured to select a first one of the first through fourth adjusted clock signals as the first selected clock signal based on a first selection signal; and a second multiplexer configured to select a second one of the first through fourth adjusted clock signals as the second selected clock signal based on a second selection signal, the second one having a phase lead of 90 degrees with respect to the first selected clock signal.

11. The quadrature error correction circuit of claim 10, wherein the first multiplexer includes:

a plurality of first transmission gates connected in parallel to a first node, the transmission gates configured to be selectively turned-on in response to first bits of the first selection signal to transfer one of the first through fourth adjusted clock signals to the first node; and an n-channel metal-oxide semiconductor (NMOS) transistor connected between the first node and a ground voltage, wherein the NMOS transistor has a gate connected to the ground voltage.

12. The quadrature error correction circuit of claim 1, wherein the plurality of control codes sets includes a first control code set, a second control code set, a third control code set and a fourth control code set, and wherein the phase interpolator includes:

a first delay circuit configured to generate a first delayed clock signal and a second delayed clock signal by delaying the second selected clock signal based on a first sub control code set of the fourth control code set; and a second delay circuit configured to generate the second delayed and selected clock single by finely adjusting a delay amount of the first delayed clock signal and the second delayed clock signal based on a second sub control code set of the fourth control code set.

13. A semiconductor memory device comprising:

a data clock buffer configured to generate a first clock signal and a second clock signal which have a phase difference of 90 degrees with respect to each other, based on a data clock signal received from a memory controller;

a quadrature error correction circuit configured to generate a first corrected clock signal and a second corrected clock signal which have a phase difference of 90 degrees with respect to each other by concurrently adjusting a skew and a duty cycle error of the first clock signal and the second clock signal; and a clock generation circuit configured to generate an output clock signal and a strobe signal based on the first corrected clock signal and the second corrected clock signal.

14. The semiconductor memory device of claim 13, further comprising:

a data input/output (I/O) buffer configured to generate a data signal by sampling data based on the output clock signal and configured to transmit the data signal and the strobe signal to the memory controller.

15. The semiconductor memory device of claim 13, wherein the data clock buffer is configured to provide the first clock signal and the second clock signal by converting a level of the data clock signal to a complementary metal-oxide semiconductor (CMOS) level.

16. The semiconductor memory device of claim 13, wherein the quadrature error correction circuit includes:

a duty cycle adjusting circuit configured to receive a first clock signal and a second clock signal which are generated based on a data clock signal, and configured to generate a first corrected clock signal and a second corrected clock signal which have a phase difference of 90 degrees with respect to each other and wherein a skew and a duty cycle error between the first corrected clock signal and the second corrected clock signal are concurrently adjusted based on a plurality of control code sets;

a first phase splitter configured to split a phase of the first corrected clock signal to output a first adjusted clock signal and a third adjusted clock signal having a phase difference of 180 degrees with respect to each other;

a second phase splitter configured to split a phase of the second corrected clock signal to output a second adjusted clock signal and a fourth adjusted clock signal having a phase difference of 180 degrees with respect to each other;

a phase interpolator configured to generate a second delayed and selected clock signal by delaying a second selection clock signal having a phase difference of 90 degrees with respect to a first selected clock signal, the first selected clock signal and the second selected clock signal being selected from among the first through fourth adjusted clock signals; and a phase detector configured to detect a phase difference between the first selected clock signal and the second delayed and selected clock signal to generate an up/down signal; and a delay control circuit configured to generate the plurality of control code sets based on the up/down signal.

17. The semiconductor memory device of claim 16, wherein the plurality of control codes sets includes a first control code set, a second control code set, a third control code set and a fourth control code set, and wherein the duty cycle adjusting circuit is configured to correct the skew and the duty cycle error between the first corrected clock signal and the second corrected clock signal by adjusting a delay of a rising edge of the second clock signal with respect to a rising edge of the first clock signal, adjusting a delay of a falling edge of the first clock signal with respect to the adjusted rising edge of the second clock signal and adjusting a delay of a falling edge of the second clock signal with respect to the adjusted falling edge of the first clock signal, based on the first control code set, the second control code set, the third control code set, and the fourth control code set, the first clock signal and the second clock signal having a phase difference of 90 degrees with respect to each other.

18. The semiconductor memory device of claim 13, wherein the clock generation circuit includes:

a first phase splitter configured to split a phase of the first corrected clock signal to output a first adjusted clock signal and a third adjusted clock signal having a phase difference of 180 degrees with respect to each other;

a second phase splitter configured to split a phase of the second corrected clock signal to output a second adjusted clock signal and a fourth adjusted clock signal having a phase difference of 180 degrees with respect to each other;

a strobe signal generator circuit configured to generate the strobe signal based on the first through fourth adjusted clock signals; and first through fourth clock multiplexers configured to generate first through fourth output clock signal pairs by combining the first through fourth adjusted clock signals, each of the first through fourth output clock signal pairs having a phase difference of 180 degrees with respect to each other, and wherein a data I/O buffer includes an output circuit configured to generate a data signal by sequentially sampling the data based on the first through fourth output clock signal pairs.

19. The semiconductor memory device of claim 18, wherein each of the first through fourth clock multiplexers includes a plurality of transmission gates and a plurality of inverters, and wherein each of the first through fourth clock multiplexers is configured to output a respective one of the first through fourth output clock signal pairs having a rising edge and a falling edge which are synchronized with rising edges of the first through fourth adjusted clock signals.

20. The semiconductor memory device of claim 18, wherein each of the first through fourth clock multiplexers includes a plurality of transmission gates and a plurality of inverters, and wherein each of the first through fourth clock multiplexers is configured to output a respective one of the first through fourth output clock signal pairs having a rising edge and a falling edge which are synchronized with rising edges and falling edges of the first through fourth adjusted clock signals.

* * * * *